(12) United States Patent
Park et al.

(10) Patent No.: US 8,709,937 B2
(45) Date of Patent: Apr. 29, 2014

(54) METHOD OF FORMING MICROPATTERN, METHOD OF FORMING DAMASCENE METALLIZATION, AND SEMICONDUCTOR DEVICE AND SEMICONDUCTOR MEMORY DEVICE FABRICATED USING THE SAME

(75) Inventors: In-sun Park, Seoul (KR); Gil-heyun Choi, Seoul (KR); Ji-soon Park, Suwon-si (KR); Jong-myeong Lee, Seongnam-si (KR); Jong-won Hong, Hwaseong-si (KR); Hei-seung Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/533,653

(22) Filed: Jun. 26, 2012

(65) Prior Publication Data
US 2013/0012023 A1    Jan. 10, 2013

(30) Foreign Application Priority Data
Jul. 6, 2011    (KR) ........................ 10-2011-0066865

(51) Int. Cl.
*H01L 21/4763*    (2006.01)

(52) U.S. Cl.
USPC ........... 438/618; 438/620; 438/622; 438/624; 438/638

(58) Field of Classification Search
None
See application file for complete search history.

(56) References Cited

U.S. PATENT DOCUMENTS

| 5,863,707 | A | * | 1/1999 | Lin | 430/313 |
| 5,893,748 | A | * | 4/1999 | Lin | 438/618 |
| 6,846,741 | B2 | * | 1/2005 | Cooney et al. | 438/638 |
| 7,390,746 | B2 | * | 6/2008 | Bai et al. | 438/689 |
| 7,842,601 | B2 | * | 11/2010 | Lee et al. | 438/622 |

FOREIGN PATENT DOCUMENTS

| JP | 2005-167120 A | | 6/2005 | |
| JP | 2005167120 A | * | 6/2005 | .......... H01L 21/3205 |
| JP | 2005-183779 A | | 7/2005 | |
| JP | 2005183779 A | * | 7/2005 | .......... H01L 21/3205 |
| JP | 2009-146966 A | | 7/2009 | |
| JP | 2009146966 A | * | 7/2009 | .......... H01L 21/3205 |

* cited by examiner

*Primary Examiner* — Duy Deo
(74) *Attorney, Agent, or Firm* — Harness, Dickey & Pierce, P.L.C.

(57) ABSTRACT

According to example embodiments, a method of forming micropatterns includes forming dummy patterns having first widths on a dummy region of a substrate, and forming cell patterns having second widths on an active line region of the substrate. The active line region may be adjacent to the dummy region and the second widths may be less than the first widths. The method may further include forming damascene metallization by forming a seed layer on the active line region and the dummy region, forming a conductive material layer on a whole surface of the substrate, and planarizing the conductive material layer to form metal lines.

22 Claims, 42 Drawing Sheets

METHOD OF FORMING MICROPATTERN, METHOD OF FORMING DAMASCENE METALLIZATION, AND SEMICONDUCTOR DEVICE AND SEMICONDUCTOR MEMORY DEVICE FABRICATED USING THE SAME

CROSS-REFERENCE TO RELATED APPLICATIONS

This application claims priority under 35 U.S.C. §119 to Korean Patent Application No. 10-2011-0066865, filed on Jul. 6, 2011, in the Korean Intellectual Property Office, the disclosure of which is incorporated herein in its entirety by reference.

BACKGROUND

Example embodiments of inventive concepts relate to a method of forming a micropattern, a method of forming a damascene metallization, and a semiconductor device fabricated using the same, and more particularly, to a method of forming a micropattern, a method of a damascene metallization, and a semiconductor device and a semiconductor memory device fabricated using the same.

To meet demands for the integration of semiconductor devices, pitches of metal lines are being decreased. Shapes of the lines of the dummy region may affect formation of active lines due to an optical proximity effect with the fineness of lines.

SUMMARY

Example embodiments of inventive concepts relate to a method of forming a micropattern.

Example embodiments of inventive concepts relate to a method of forming a damascene metallization by which dummy lines can be formed without sacrificing any one of a photolithography side and a conductor burying side of fabricating.

Example embodiments of inventive concepts relate to a semiconductor device having dummy lines fabricated using the methods.

Example embodiments of inventive concepts relate to a semiconductor memory device having dummy lines fabricated using the methods.

According to example embodiments of inventive concepts, a method of forming micropatterns on a substrate having a dummy region adjacent to an active line region, includes forming a first mask covering at least a part of the dummy region and exposing a portion of the substrate, forming mold mask patterns on the first mask and the exposed substrate, forming spacers on sidewalls of the mold mask patterns, forming second masks by removing parts of the first mask exposed through the mold mask patterns and the spacers, removing the mold mask patterns, and forming the micropatterns by etching the substrate using the spacers and the second masks as etch masks. The first mask may cover all of the dummy region. Patterns having widths wider than widths of patterns of the active line region may be obtained in the dummy region through the etching of the substrate. The substrate may include two active line regions which are adjacent to each other so that the dummy region is between the active line regions, and the mold mask patterns may include crossing sub-patterns which connect the two active line regions.

At least some of the mold mask patterns may have line-and-space sub-patterns across the active line region and the dummy region. Lines of the line-and-space sub-patterns may be arranged at uniform intervals. A ratio between widths of the lines of the line-and-space sub-patterns and widths of spaces of the line-and-space sub-patterns may be between about 1:2.5 and about 1:3.

At least one of the lines of the at least some of the mold mask patterns of the dummy region may extend to at least an end of the first mask.

The forming the spacers may include forming a spacer material layer on the substrate, the first mask, and the mold mask patterns, and anisotropically etching the spacer material layer, wherein an end of at least one of lines of the at least some of the mold mask patterns of the dummy region exists on the first mask, a distance between the end of the line of the at least some of the mold mask patterns and an end of the first mask positioned in a direction in which the line of the at least some of the mold mask patterns extends may be greater than a thickness of the spacer material layer. A distance between the end of the line of the at least some of the mold mask patterns and a most adjacent mold mask patterns except for the line of the at least some of the mold mask patterns may be greater than two times the thickness of the spacer material layer.

The forming the spacers may include forming a spacer material layer on the substrate, the first mask, and the mold mask patterns, and anisotropically etching the spacer material layer, wherein two adjacent lines of the lines of the at least some of the mold mask patterns of the dummy region have narrower widths at ends of the two adjacent lines than at other parts of the two adjacent lines, and a bridge spacer is on sidewalls of the mold mask patterns except for the two adjacent lines and the bridge spacer connects to spacers on the two adjacent lines. The substrate may include two active line regions that are adjacent to each other so that the dummy region is between the two active regions, and the bridge spacer may on sidewalls of the parts of the mold mask patterns connecting the two active line regions.

According to example embodiments of inventive concepts, a method of forming micropatterns includes forming mold mask patterns on an active line region and a dummy region of a substrate, the mold mask patterns including sidewalls and line-and-space sub-patterns having the equal widths and distances, forming spacers on sidewalls of the mold mask patterns, forming a first mask that covers the mold mask patterns and the spacers of the dummy region and exposes a part of the mold mask patterns, removing the part of the mold mask patterns exposed after forming the first mask to leave a remaining mold mask pattern, removing the first mask, and etching the substrate using the spacers and the remaining mold mask patterns as etch masks. The active line region may be adjacent to the dummy region.

A ratio between a width of the lines of the line-and-space sub-patterns and a width of the spaces of the line-and-space sub-patterns may be between about 1:2.5 and about 1:3. An end of at least one of the lines of the mold mask patterns of the dummy region may have an end positioned underneath the first mask to overlap with the first mask. Ends of at least two adjacent lines of the lines of the mold mask patterns of the dummy region may be positioned underneath the first mask to overlap with the first mask.

The first mask may cover all of the dummy region. The substrate may include two active line regions which are adjacent to each other so that the dummy region between the active line region, and the mold mask patterns may include crossing sub-patterns that connect the two adjacent active line regions.

The forming spacers may include forming a spacer material layer on the substrate and the mold mask patterns, anisotropically etching the spacer material layer. An end of at least one of lines of the mold mask patterns of the dummy region may be under the first mask, and a distance between the end of the at least one line of the dummy region and an end of the first and the crossing sub-patterns may be smaller than two times the thickness of the spacer material layer.

The forming spacers may include forming a spacer material layer on the substrate and the mold mask patterns, and anisotropically etching the spacer material layer, wherein an end of at least one of lines of the mold mask patterns of the dummy region is under the first mask, and a distance between the end of the line and an end of the first mask positioned in a direction in which the line extends is greater than the thickness of the spacer material layer.

A distance between the line and a most adjacent line of the mold mask patterns may be greater than two times the thickness of the spacer material layer. Patterns having widths wider than widths of patterns of the active line region may be obtained in the dummy region through the etching of the substrate.

The substrate may include a first insulating layer, an etch stop layer formed on the first insulating layer, a second insulating layer formed on the etch stop layer. The etching of the substrate using the spacers and the remaining mold mask patterns as the etch masks may include recessing the second insulating layer using the spacers and the remaining mold mask patterns as etch masks. The method may further include burying a conductive material in the recesses after etching the substrate. The conductive material may be Cu or a Cu alloy.

According to example embodiments of inventive concepts, a method of forming damascene metallization on a substrate includes forming a first mask on a substrate. The substrate may include a dummy region adjacent to an active line region, a first insulating layer, an etch stop layer on the first insulating layer, a second insulating layer on the etch stop layer, and a sacrificial layer on the second insulating layer. The first mask may cover at least a part of the dummy region and expose a portion of the substrate. The method further includes forming mold mask patterns on the first mask and the exposed portion of the substrate, forming spacers on sidewalls of the mold mask patterns; removing a part of the first mask exposed through the mold mask patterns and the spacers to form second masks; removing the mold mask patterns; etching the sacrificial layer and a second insulating layer using the spacers and the second masks as etch masks to form recesses; and forming a conductive material in the recesses. The conductive material may be a copper (Cu) or a Cu alloy.

According to example embodiments of inventive concepts, a method of forming damascene metallization includes forming dummy patterns having first widths on a dummy region of a substrate, and forming cell patterns having second widths on an active line region of the substrate. The active line region may be adjacent to the dummy region and the second widths may be less than the first widths. The method further includes forming a seed layer on the active line region and the dummy region, forming a conductive material layer on a whole surface of the substrate, and planarizing the conductive material layer to form metal lines.

The forming the conductive material layer may be performed using electroplating. The planarization of the conductive material layer may be performed using chemical mechanical polishing (CMP) or etch back. The cell patterns and the dummy patterns may be simultaneously formed.

The forming the dummy patterns may include forming mold mask patterns in the dummy region, and forming a first mask on or underneath the mold mask patterns of the dummy region.

According to example embodiments of inventive concepts, a semiconductor device includes a semiconductor substrate that includes an active line region and a dummy region adjacent to the active line region; a plurality of cell lines which are disposed in cell trenches formed in the active line region; and a plurality of dummy lines which are disposed in dummy trenches formed in the dummy region, wherein distances among the dummy lines are wider than distances among the cell lines.

The dummy lines may include two or more dummy lines, wherein ends of the two or more dummy lines are connected to one another. The dummy lines may include one or more dummy lines, wherein widths of ends of the dummy lines are wider than widths of another parts of the dummy lines.

According to example embodiments of inventive concepts, a semiconductor memory device includes a string selection line (SSL) and a ground selection line (GSL) on a substrate, a group of wordlines extending in a first direction between the string selection line (SSL) and the ground selection line (GSL), a first bitline set and a second bit line set on the group of wordlines, the first bitline set and the second bitline set extending in a second direction that is different from the first direction, the first bitline set and the second bitline set being electrically connected to the SSL, a common source line (CSL) which is electrically connected to the GSL, and a plurality of dummy bitlines between the first and second bitline sets. The dummy bitlines may be separated by a first distance that is greater than a second distance separating at least two bitlines of the first bitline set.

The semiconductor memory device may further include CSL taps electrically connected to the CSL. A level of the CSL taps may be equal to levels of the dummy bitlines.

A level of the CSL may be higher than levels of the wordlines and lower than levels of the first and second bitline sets. The dummy bitlines may be physically connected to the SSL through vias. At least two or more dummy bitlines are connected to one another.

According to example embodiments of inventive concepts, a method of forming micropatterns includes forming mold mask patterns on a substrate, the mold mask patterns including at least two first mold structures on an active line region of the substrate and at least two second mold structures on a dummy region of the substrate, the at least two first and second mold structures each having sidewalls; forming a spacer pattern including first spacers on the sidewalls of the at least two first mold structures, and second spacers on the sidewalls of the at least two second mold structures, forming the micropattern by removing a portion of the active line region of the substrate not covered by the first spacers, and removing a portion of the dummy region of the substrate not covered by the at least two second mold structures and the second spacers.

The method may include forming a first mask that covers all of the dummy region of the substrate. The forming mold mask patterns on the substrate may include forming the at least two second mold structures on the first mask. The forming a spacer pattern may include forming the second spacers on the first mask. The forming the micropatterns forming a second mask by etching a part of the first mask exposed between the second spacers, removing the at least two first and second mold structures, and etching the substrate using the first and second spacers and the second mask an etch mask.

The method may include forming a first mask that covers all of the dummy region of the substrate, the at least two second mold structures, and the second spacers; removing the at least two first mold structures after forming the first mask;

and removing the first mask after removing the at least two first mold structures. The forming the micropatterns may include etching the substrate using the first spacers, the at least two second mold structures, and the second spacers as an etch mask.

According to example embodiments of inventive concepts, a method of forming damascene metallization may include the foregoing method of forming micropatterns, wherein the substrate further includes a first insulating layer, an etch sop layer on the first insulating layer, and a sacrificial layer on the second insulating layer. The forming the micropatterns may include forming first recesses by removing a portion of the sacrificial layer and the second insulating layer in the active line region of the substrate that is not covered by the first spacers, and forming second recesses by removing a portion of the sacrificial layer and the second insulating layer in the dummy region of the substrate that is not covered by the at least two second mold structures and the second spacers. The method further includes forming a conductive material in the first and second recesses.

BRIEF DESCRIPTION OF THE DRAWINGS

The foregoing and other features of inventive concepts will be more clearly understood from the following detailed description of non-limiting embodiments of inventive concepts, taken in conjunction with the accompanying drawings in which like reference refer to the same parts throughout the different views. The drawings are not necessarily to scale, emphasis instead being placed upon illustrating the principles of inventive concepts. In the drawings.

DETAILED DESCRIPTION OF THE EMBODIMENTS

Figure 1A:
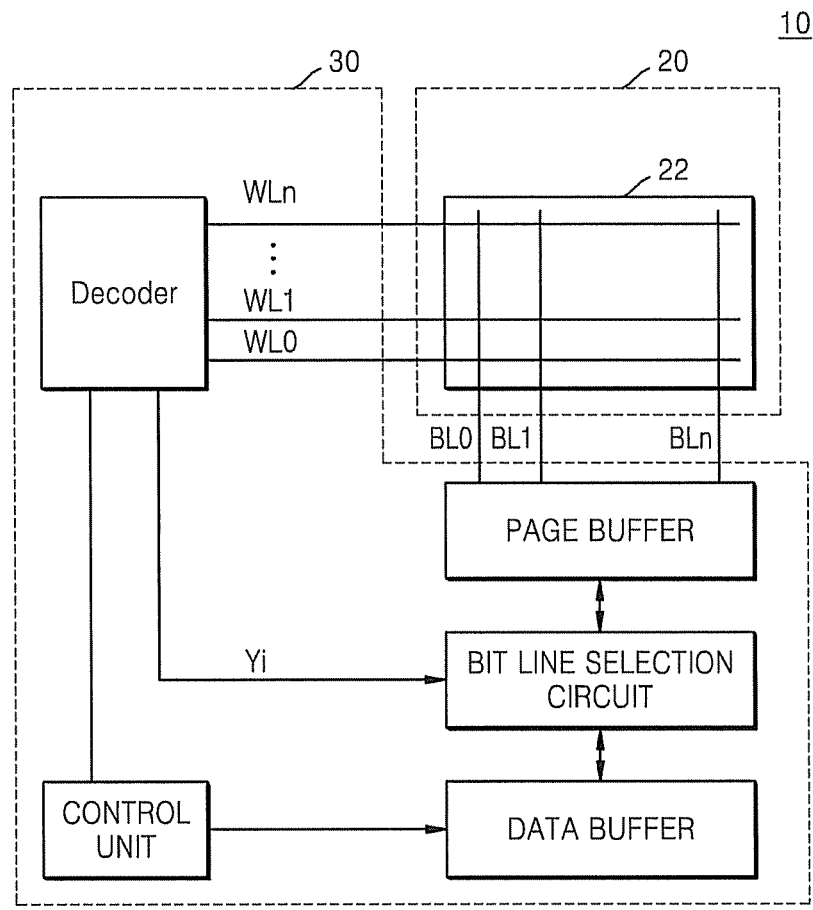
FIGS. 1A and 1B are views conceptually illustrating a structure of a memory device.

Example embodiments of inventive concepts will now be described more fully with reference to the accompanying drawings, in which some example embodiments of inventive concepts are shown. Example embodiments of inventive concepts may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element or layer is referred to as being "formed on," another element or layer or "connected to" or coupled to" another element, it can be directly or indirectly formed on, connected to, or coupled to the other element or layer. That is, for example, intervening elements or layers may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

The terminology used herein is for describing particular embodiments and is not intended to be limiting of example embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are used to distinguish one element, component, region, layer or section from another region, layer or section. Thus, a first element, component, region, layer or section discussed below could be termed a second element, component, region, layer or section without departing from the teachings of example embodiments.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1A is a block diagram conceptually illustrating a semiconductor device 10 according to example embodiments of inventive concepts. Referring to FIG. 1A, the semiconductor device 10 is a memory device and includes a cell region 20 in which a plurality of cell arrays are arrayed and a peripheral region 30 which is to drive cells of the cell region 20. A decoder is connected to a cell array 22 through wordlines $WL_0, WL_1, \ldots,$ and $WL_n$ and may be controlled by a control unit. The decoder receives an address from an external memory controller (not shown) and generates a selection signal Yi to select one of the wordlines $WL_0, WL_1, \ldots,$ and $WL_n$ or one of bitlines $BL_0, BL_1, \ldots,$ and $BL_m$. The decoder may transfer the selection signal Yi to a bit line selection circuit. The bitline selection circuit may select a bit line $BL_0, BL_1, \ldots,$ and $BL_m$ in response to the selection signal Yi. A page buffer is connected to the cell array 22 through the bitlines $BL_0, BL_1, \ldots,$ and $BL_m$. The page buffer may temporarily store data loaded from the external memory controller (not shown). In the page buffer, data is loaded in the volume of a page and the loaded data may be programmed in a selected page during a programming operation. On the other hand, during a read operation, the page buffer may read data from a page and temporarily store the read data. The read data may be transferred to the data buffer. The data buffer may be an input/output buffer used for data transmission between the external memory controller (not shown) and the cell array 22, but example embodiments are not limited thereto.

A plurality of cell blocks are arrayed in the cell array 22 so that intermediate regions are regularly disposed among the plurality of cell blocks. The intermediate regions may include dummy regions and tap regions.

Figure 1B:
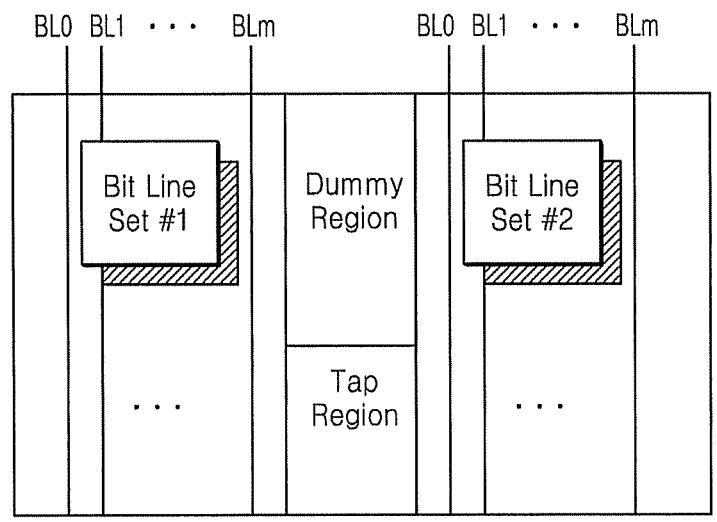

FIG. 1B is a view conceptually illustrating a part of the cell array 22 according to example embodiments of inventive concepts. Referring to FIG. 1B, two bitline sets are adjacent to each other so that an intermediate region including a dummy region and a tap region is disposed between the two bitline sets. The two bitline sets may be positioned in cell blocks.

A plurality of memory devices are densely formed in the cell blocks in which the two bitline sets are positioned, and gate electrodes of the memory devices are connected to the wordlines $WL_0, WL_1, \ldots,$ and $WL_n$. Different active lines having line-and-space patterns like the bitlines $BL_0, BL_1, \ldots,$ and $BL_m$ may be formed in each of the cell blocks. Also, bitlines are illustrated as active lines in FIG. 1B, but a series of parallel wordlines may be disposed as the active lines.

If patterns are not formed at all in a dummy region positioned between continuous line-and-space patterns, an undesirable phenomenon such as dishing or erosion may occur when fabricating a semiconductor device. Also, active lines adjacent to the dummy region may be optically harmfully affected due to an optical proximity effect. To mitigate (and/or prevent) the optical proximity effect, dummy lines may be formed in the dummy region.

If the lines are formed of copper (Cu) or a Cu alloy, a damascene process may be used to form the lines instead of forming the metal lines through a deposition process and a photolithography process. The lines may be formed using electroplating performed after a barrier layer and a seed layer is formed or using electroless plating.

To limit (and/or exclude) the optical proximity effect, the dummy lines of the dummy region may be formed in the same widths and pitches as those of the active lines.

Figure 2A:
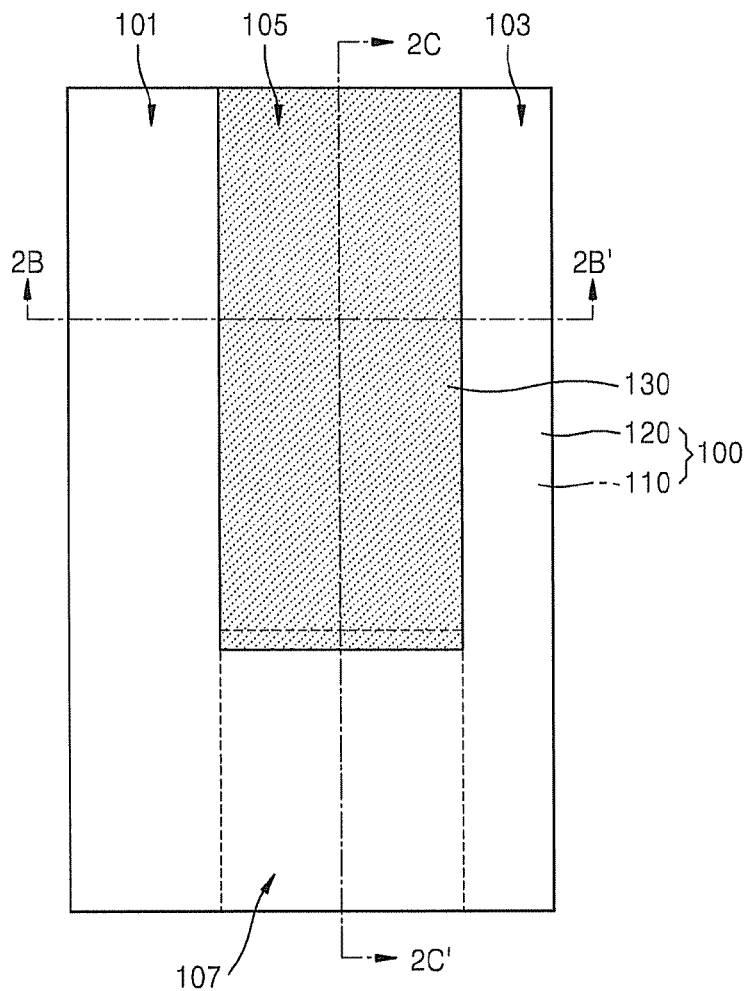
FIGS. 2A through 8F are views illustrating a method of forming a micropattern according to example embodiments of inventive concepts.

FIGS. 2A through 8F are views illustrating a method of forming a micropattern according to example embodiments of inventive concepts. FIG. 2B is a cross-sectional view taken along a line 2B-2B' of FIG. 2A, and FIG. 2C is a cross-sectional view taken along a line 2C-2C' of FIG. 2A. Referring to FIGS. 2A through 2C, a first mask 130 is formed on a substrate 100.

The substrate 100 may have a structure in which a plurality of material layers are stacked. For example, the substrate 100 may include a first insulating layer 112, an etch stop layer 114 formed on the first insulating layer 112, a second insulating layer 116 formed on the etch stop layer 114, and a sacrificial layer 120 formed on the second insulating layer 116. However, example embodiments of inventive concepts are not limited thereto, and various types of semiconductor substrates may be further included underneath the first insulating layer 112.

The substrate 100 includes active line regions 101 and 103, a dummy region 105, and a tap region 107 on a main surface thereof. In FIG. 2A, for convenience, the dummy region 105 is interposed between the two active line regions 101 and 103. Also, the tap region 107 is adjacent to the dummy region 105 to form taps of other lines such as a common source line (CSL). However, the inventive concept is not limited to this layout arrangement. The active line regions 101 and 103 and the tap region 107 are conceptually separated from one another for convenience but may not be physically separated from one another.

The first and second insulating layers 112 and 116 may be respectively silicon oxide layers but example embodiments of inventive concepts are not limited thereto. Alternatively, the first and second insulating layers 112 and 116 may be independently fluorinated silicate glasses (FSGs), silicon nitrides, or amorphous SiC:H The first insulating layer 112 may be formed on a lower substrate (not shown) using a chemical vapor deposition (CVD) method or may be formed by thermally oxidizing a portion of the lower substrate. The second insulating layer 116 may be formed using a CVD method. However, example embodiments are not limited thereto.

The etch stop layer 114 may be needed if the above-mentioned damascene process is used and may be formed of any material having appropriate etch selectivity with the second insulating layer 116. For example, the etch stop layer 114 may be a silicon nitride layer, but example embodiments are not limited thereto.

The sacrificial layer 120 may be formed of polysilicon using a method such as CVD, but example embodiments are not limited thereto.

The first insulating layer 112, the etch stop layer 114, and the second insulating layer 116 may constitute an interlayer insulating layer 110.

The first mask 130 disposed on the sacrificial layer 120 may be formed in a dummy region of the substrate 100. The first mask 130 may cover an entire surface of the dummy region. In FIG. 2A, the first mask 130 covers the entire surface of the dummy region. A first mask material layer (not shown) may be formed, and then a region covered with the first mask 130 may be defined through a photolithography process, thereby forming the first mask 130. The first mask 130 may be formed of silicon nitride, but example embodiments are not limited thereto. Therefore, a material of which the first mask 130 is to be formed may be appropriately selected in consideration of etch selectivity.

Figure 3A:
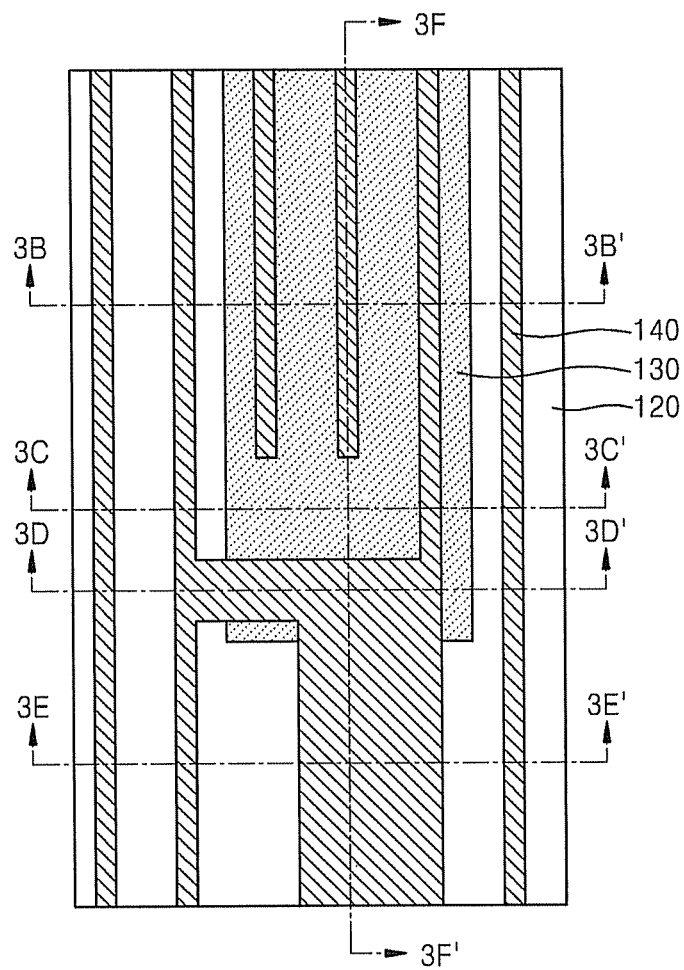
Figure 3B:
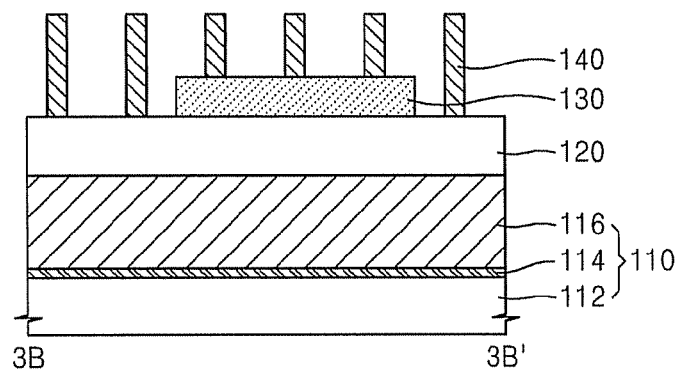
Figure 3C:
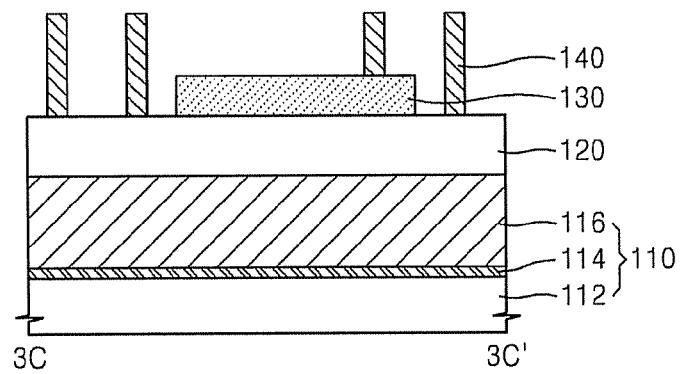
Figure 3D:
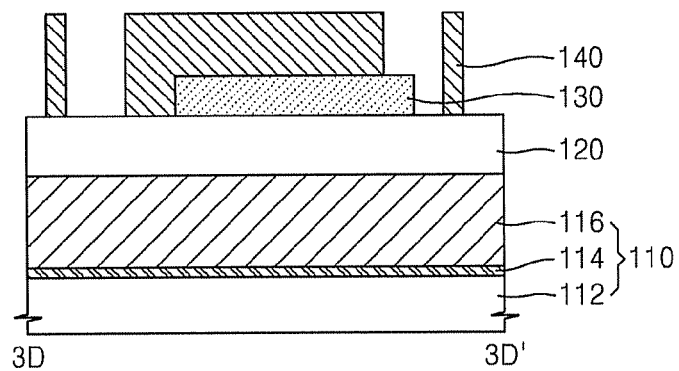
Figure 3E:
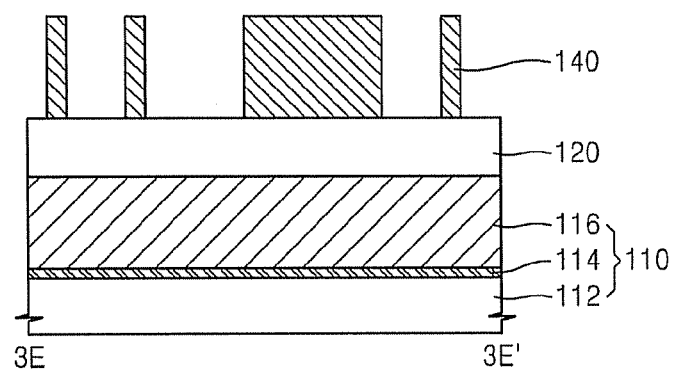
Figure 3F:
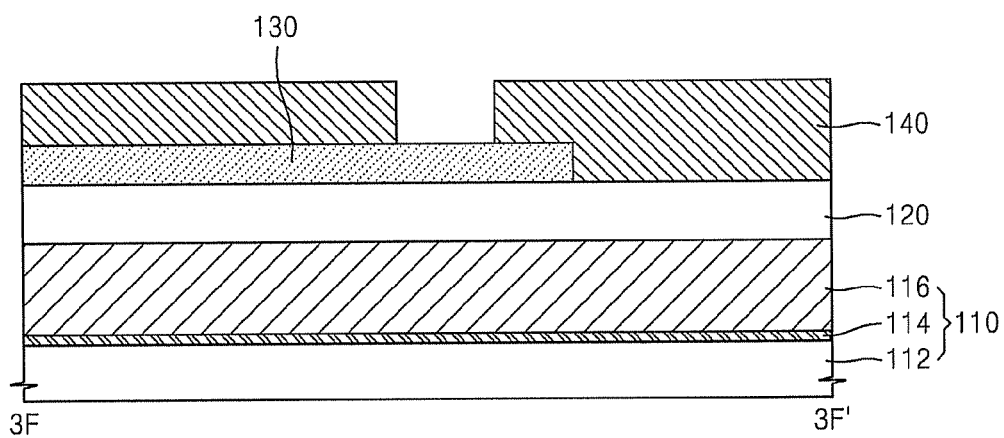

FIGS. 3A through 3F will now be referred to. FIG. 3B is a cross-sectional view taken along a line 3B-3B' of FIG. 3A, and FIG. 3C is a cross-sectional view taken along a line 3C-3C' of FIG. 3A. FIG. 3D is a cross-sectional view taken along a line 3D-3D' of FIG. 3A, FIG. 3E is a cross-sectional view taken along a line 3E-3E' of FIG. 3A, and FIG. 3F is a cross-sectional view taken along a line 3F-3F' of FIG. 3A. Referring to FIGS. 3A through 3F, mold mask patterns 140 are formed on the first mask 130 and an exposed part of the substrate 100.

As will be described later, the mold mask patterns 140 may be patterns having sidewalls on which spacers are to be formed so that the spacers are used to pattern material layers formed underneath the spacers. In particular, line-and-space sub-patterns are included herein but are illustrated as non-limiting examples. Therefore, example embodiments of inventive concepts are not limited thereto.

The mold mask patterns 140 may be, for example, carbon-containing layers, in particular, may be amorphous carbon layers (ACLs) or spin-on hard masks (SOHs). An organic compound is spin-coated to a thickness between about 1000 Å and about 5000 Å to form an organic compound layer, thereby forming the mold mask patterns 140. The organic compound may be an aromatic ring-containing hydrocarbon compound, such as phenyl, benzene, or naphthalene, or a derivative thereof. The organic compound may be formed of a material having a relatively high carbon content between about 85 w % and about 99 w % based on a total weight thereof. The organic compound layer may be first baked at a temperature between about 150° C. and 350° C. to form a carbon-containing layer. The first baking may be performed for about 60 seconds, but example embodiments are not limited thereto. The carbon-containing layer is secondly baked and hardened at a temperature between about 300° C. and 550° C. The secondly baking may be performed for about 30 seconds to 300 seconds, but example embodiments are not limited thereto. Although a deposition process is performed at a relatively high temperature of about 400° C. or more when the carbon-containing layer is hardened through the secondly baking process to form another material layer on the carbon-containing layer, the deposition process does not affect the carbon-containing layer.

Photoresist (not shown) may be coated on the carbon-containing layer, and an exposure process may be performed using exposure masks having the same patterns as the mold mask patterns 140 as shown in FIG. 3A. In particular, when the line-and-space sub-patterns are formed as shown in FIG. 3A, the exposure masks may be designed so that widths and distances of lines of the active line regions 101 and 103 and the dummy region 105 are uniform. If the widths and distances of the lines of the active line regions 101 and 103 and the dummy region 105 are uniform, optical defects caused by differences among patterns of active line regions and a dummy region, e.g., device defects caused by an optical proximity effect, may be prevented.

Then, a developing process and etching of the carbon-containing layer are performed after the exposure process is performed as described above to obtain the mold mask patterns 140. In the line-and-space sub-patterns of the mold mask patterns 140, a ratio between widths of the lines and widths of the spaces may be between about 1:2.5 and about 1:3. If the ratio between the widths of the lines and the widths of the spaces is 1:3, a conformal material layer having the same thickness as the widths of the lines may be formed and anisotropically etched, thereby obtaining spacers. Also, a lower layer may be etched using the spacers as etch masks to obtain lower patterns having uniform widths and distances. If the ratio between the widths of the lines and the widths of the spaces is 1:2.5, a conformal material layer having a thickness thinner than the widths of the lines may be formed and aniso-tropically etched, thereby obtaining spacers. Also, the lower layer may be etched using the spacers as etch masks to obtain lower patterns having uniform widths and distances.

The mold mask patterns 140 are formed on the first mask 130 as described above, but the first mask 130 may be formed on the mold mask patterns 140. A pattern according to example embodiments in which the first mask 130 is formed on the mold mask patterns 140 will be described later.

Figure 4A:
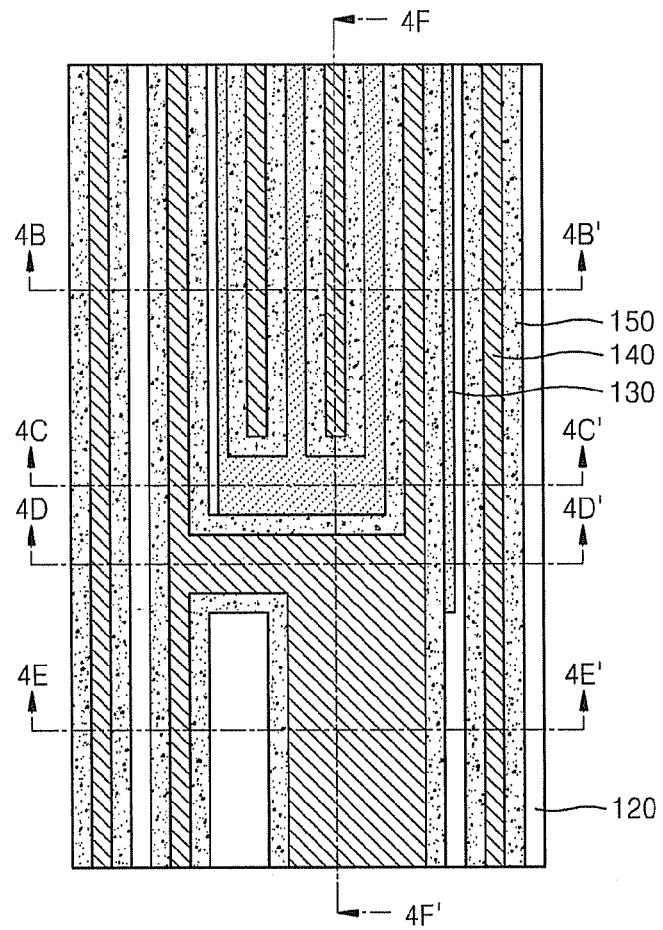
Figure 4B:
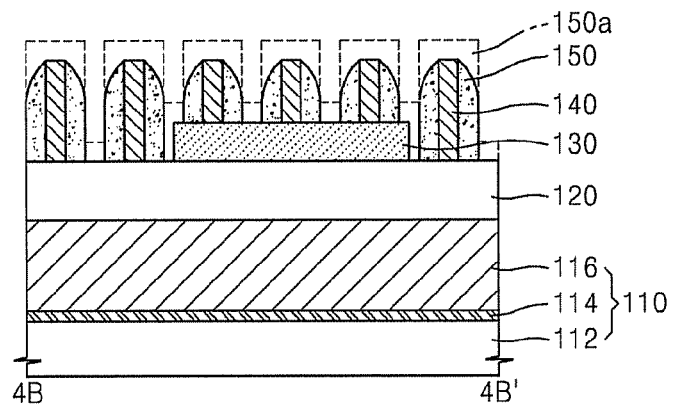
Figure 4C:
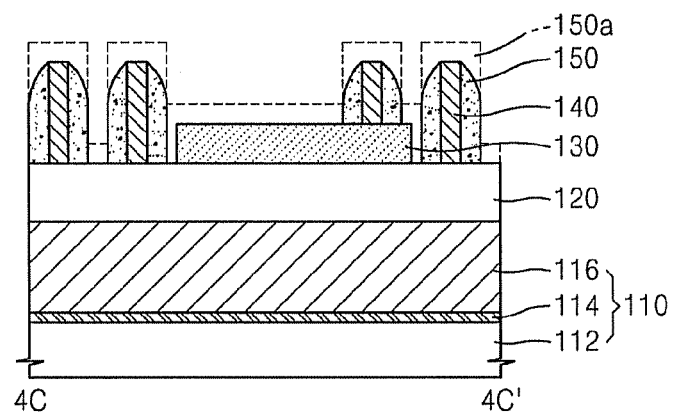
Figure 4D:
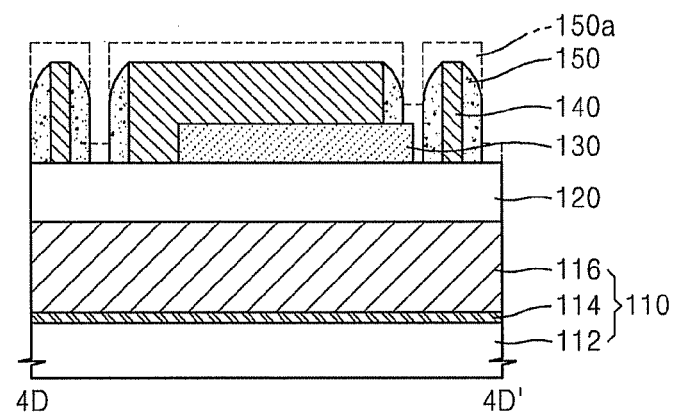
Figure 4E:
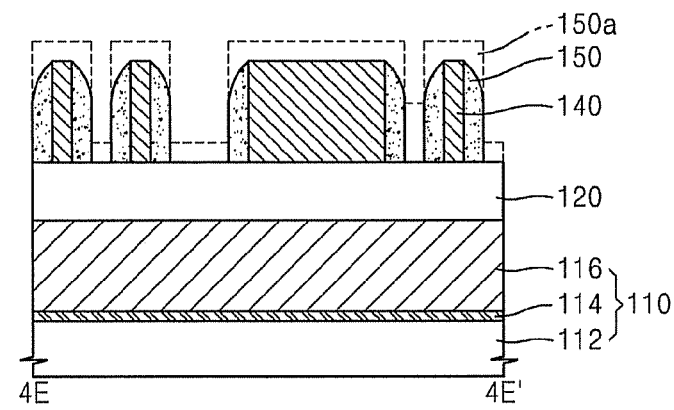
Figure 4F:
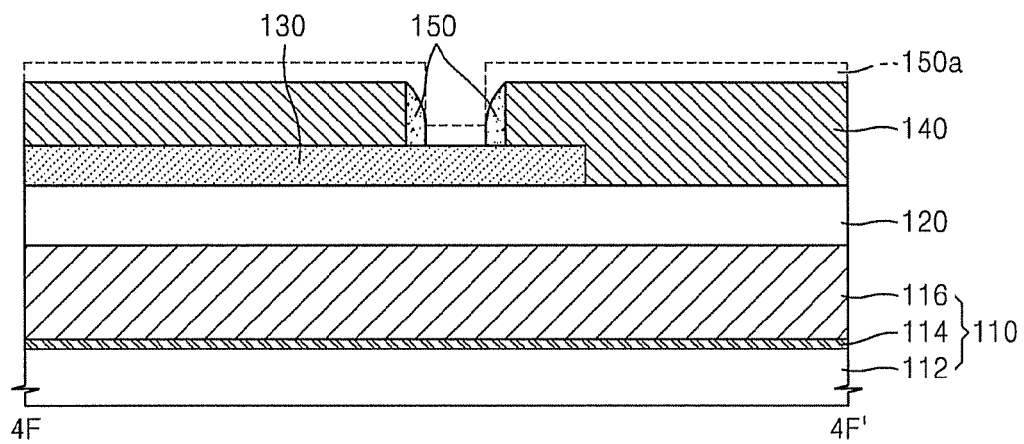

FIGS. 4A through 4F will now be referred to. FIG. 4B is a cross-sectional view taken along a line 4B-4B' of FIG. 4A, and FIG. 4C is a cross-sectional view taken along a line 4C-4C' of FIG. 4A. FIG. 4D is a cross-sectional view taken along a line 4D-4D' of FIG. 4A, FIG. 4E is a cross-sectional view taken along a line 4E-4E' of FIG. 4A, and FIG. 4F is a cross-sectional view taken along a line 4F-4F' of FIG. 4A. Referring to FIGS. 4A through 4F, spacers 150 are formed on sidewalls of the mold mask patterns 140.

To form the spacers 150, a spacer material layer 150a is conformally formed on whole surfaces of the substrate 100, the first mask 130, and the mold mask patterns 140 and then anisotropically etched.

The spacer material layer 150a may be formed of any material having etch selectivity with the sacrificial layer 120 and the mold mask patterns 140, and, for example, may be formed of silicon oxide. The spacer material layer 150a may be selected to have etch selectivity with the first mask 130 or may be selected not to have etch selectivity with the first mask 130. In FIGS. 4A through 4F, the spacer material layer 150a is illustratively chosen to have etch selectivity with the first mask 130. A case where the spacer material layer 150a does not have etch selectivity with the first mask 130 will be described later.

If the spacer material layer 150a has an etch selectivity with the first mask 130, spacers may be formed even on a sidewall of the first mask 130 as shown in FIGS. 4A through 4F or spacer material may remain on the sidewall of the first mask 130. However, for the convenience of identification, the spacers 150 are formed on the sidewalls of the mold mask patterns 140 in FIGS. 4A through 4F.

The spacer material layer 150a may be formed using atomic layer deposition (ALD) or chemical vapor deposition (CVD), but example embodiments are not limited thereto.

As described above, the thickness of the spacer material layer 150a may be appropriately adjusted in consideration of the ratio between the widths of the lines and spaces of the line-and-space sub-patterns of the mold mask patterns 140. For example, if the ratio between the widths of the lines and the widths of the spaces is 1:3, the thickness of the spacer material layer 150a may be the same as the widths of the lines. If the ratio between the widths of the lines and the widths of the spaces is 1:2.5, the thickness of the spacer material layer 150a may be about 0.75 times the widths of the lines.

Figure 5A:
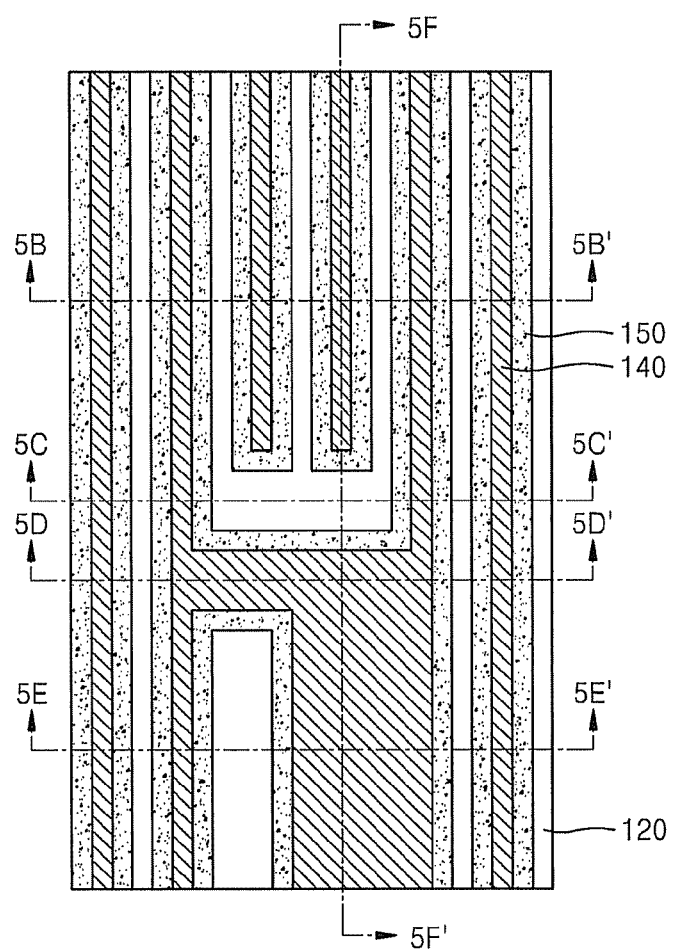
Figure 5B:
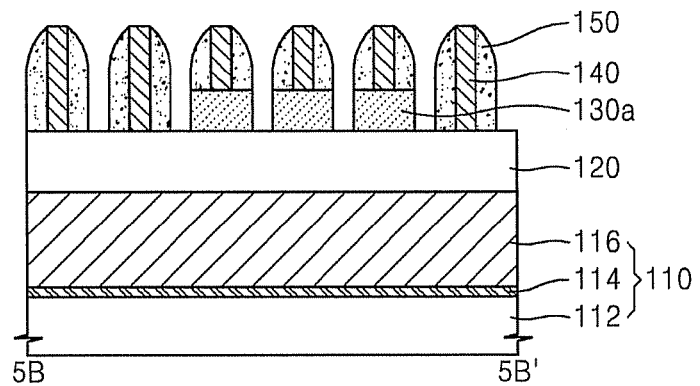
Figure 5C:
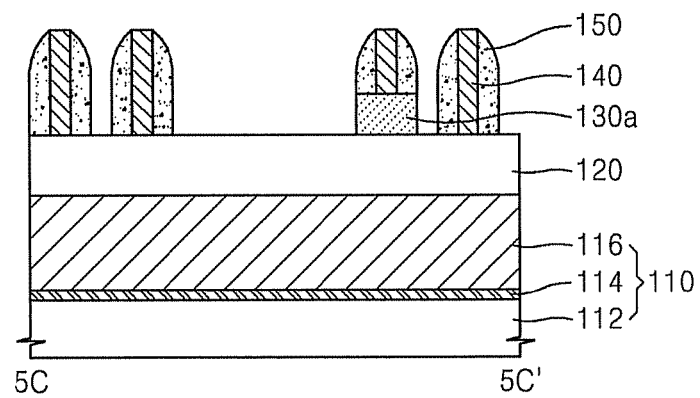
Figure 5D:
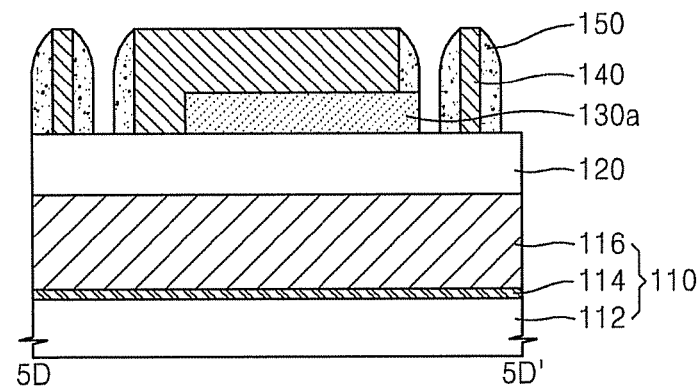
Figure 5E:
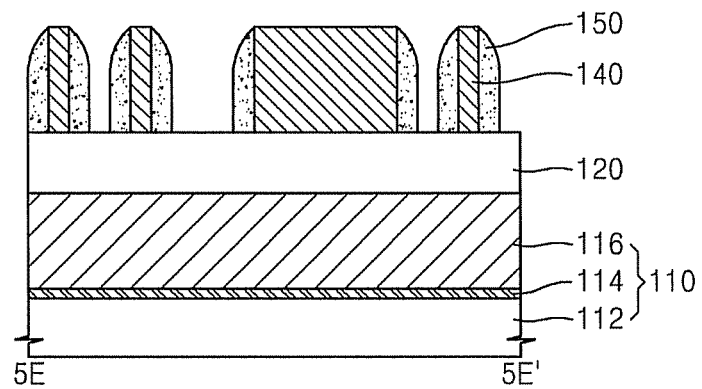
Figure 5F:
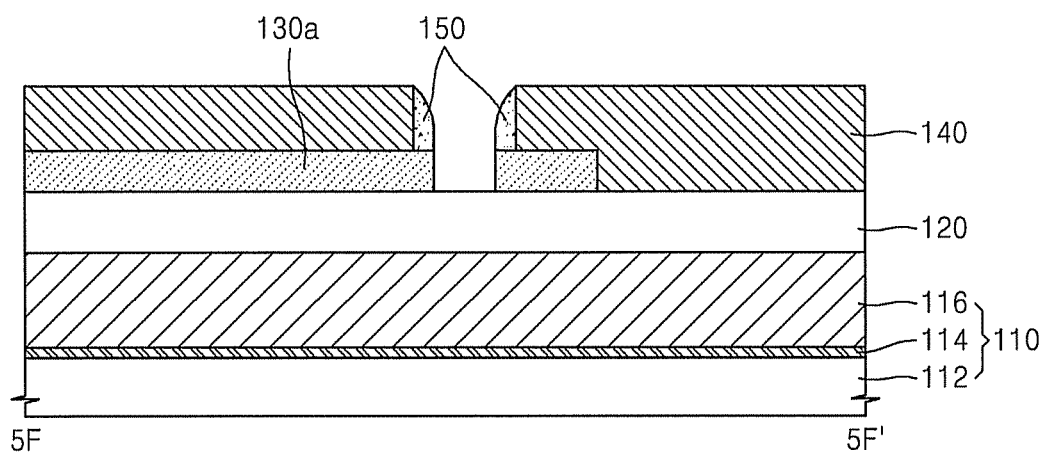

FIG. 5B is a cross-sectional view taken along a line 5B-5B' of FIG. 5A, and FIG. 5C is a cross-sectional view taken along a line 5C-5C' of FIG. 5A. FIG. 5D is a cross-sectional view taken along a line 5D-5D' of FIG. 5A, FIG. 5E is a cross-sectional view taken along a line 5E-5E' of FIG. 5A, and FIG. 5F is a cross-sectional view taken along a line 5F-5F' of FIG. 5A. Referring to FIGS. 5A through 5F, a part of the first mask 130 exposed through the mold mask patterns 140 and the spacers 150 is removed, thereby forming second masks 130a.

To form the second masks 130a, the first mask 130 is anisotropically etched using the mold mask patterns 140 and the spacers 150 as etch masks. The anisotropic etching may use a dry etch method such as plasma etching. Also, additional anisotropic etching may be performed to remove a spacer material remaining on the sidewall of the first mask 130.

The formation of the spacers 150 and the formation of the second masks 130a are sequentially performed herein. However, the spacers 150 and the second masks 130a may be simultaneously formed in a single etching process. In other words, if materials are selected or etching conditions are set so that the spacer material layer 150a does not have etch selectivity with the first mask 130 or has a slight etch selectivity with the first mask 130, and the space material layer 150a and the first mask 130 have relatively high etch selectivities with the sacrificial layer 120 and the mold mask patterns 140, the spacers 150 and the second masks 130a may be formed at a time in a single anisotropic etching process. As a result, as shown in FIG. 5B, widths of the second masks 130a formed underneath the mold mask patterns 140 having line-and-space shapes may be wider than those of the spacers 150.

Figure 6A:
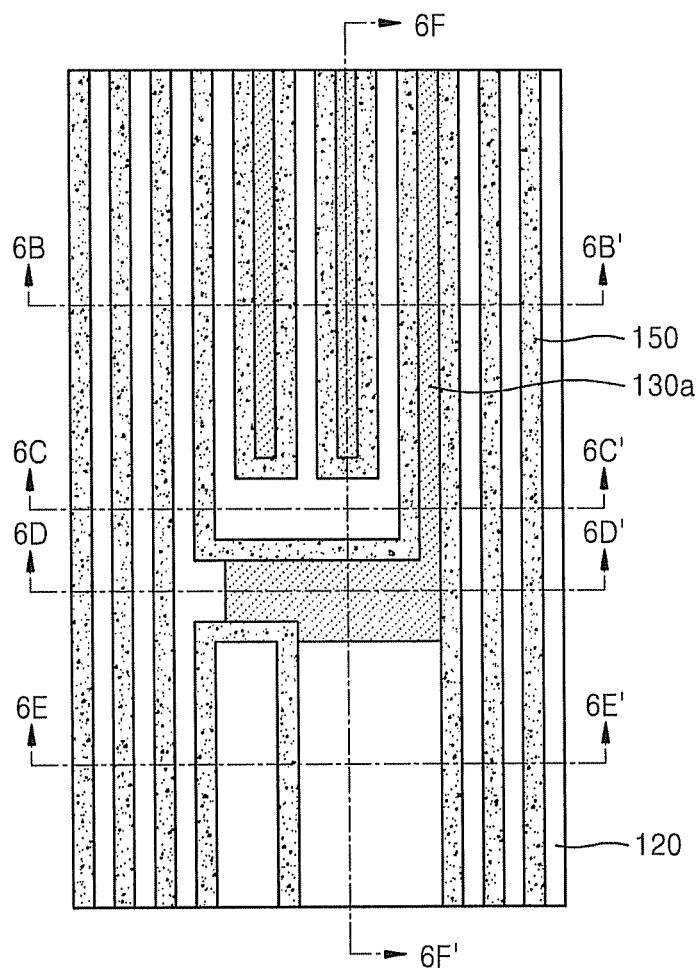
Figure 6B:
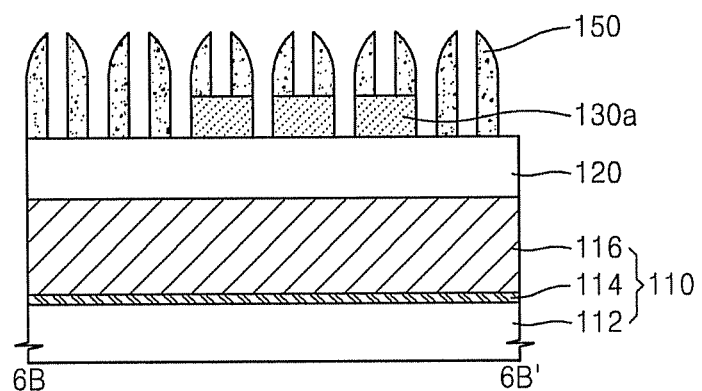
Figure 6C:
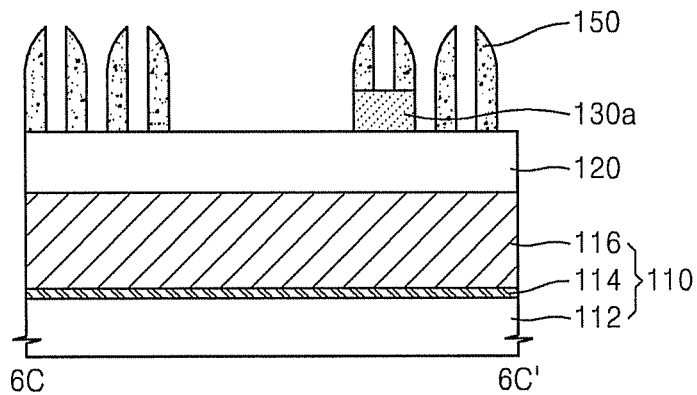
Figure 6D:
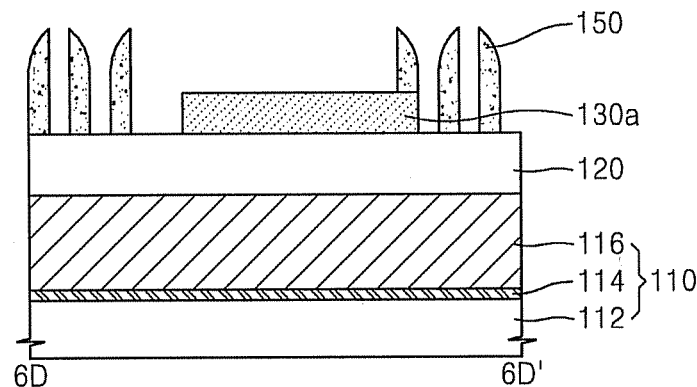
Figure 6E:
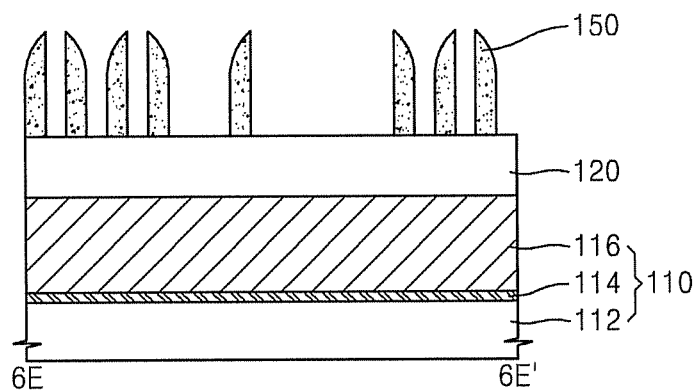
Figure 6F:
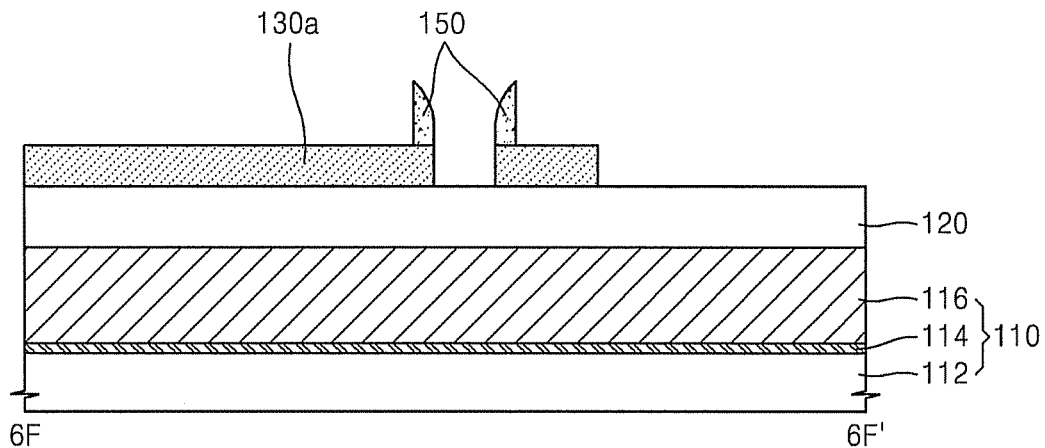

FIGS. 6A through 6F will now be referred to. FIG. 6B is a cross-sectional view taken along a line 6B-6B' of FIG. 6A, and FIG. 6C is a cross-sectional view taken along a line 6C-6C' of FIG. 6A. FIG. 6D is a cross-sectional view taken along a line 6D-6D' of FIG. 6A, FIG. 6E is a cross-sectional view taken along a line 6E-6E' of FIG. 6A, and FIG. 6F is a cross-sectional view taken along a line 6F-6F' of FIG. 6A. Referring to FIGS. 6A through 6F, the mold mask patterns 140 are removed.

As mentioned above, since the mold mask patterns 140 are formed of a carbon-based material, the mold mask patterns 140 may be almost completely removed through heating without a high thermal budget. Here, since a temperature of the heating is not high, for example between about 100° C. and 300° C., the second masks 130a may be negligibly removed so the second masks 130a may be preserved.

When the mold mask patterns 140 are removed, the spacers 150 formed on the sidewalls of the mold mask patterns 140 remain. Therefore, if the spacers 150 are used as etch masks, the spacers 150 may transfer doubled pattern density to a layer formed underneath the spacers 150.

Also, parts of the second masks 130a positioned underneath the mold mask patterns 140 may be exposed through the removal of the mold mask patterns 140. However, as will be described later, the second masks 130a act as etch masks when etching the sacrificial layer 120 positioned underneath the second masks 130a. Therefore, although parts of the mold mask patterns 140 remain on the second masks 130a, a subsequent etching may not be affected.

The sacrificial layer 120 may be directly exposed in a region in which parts of the second masks 130a do not exist, through the removal of the mold mask patterns 140. Since the spacers 150 are to act as etch masks, the mold mask patterns 140 remaining directly on the sacrificial layer 120 are desired to be fully removed without residues.

Figure 7A:
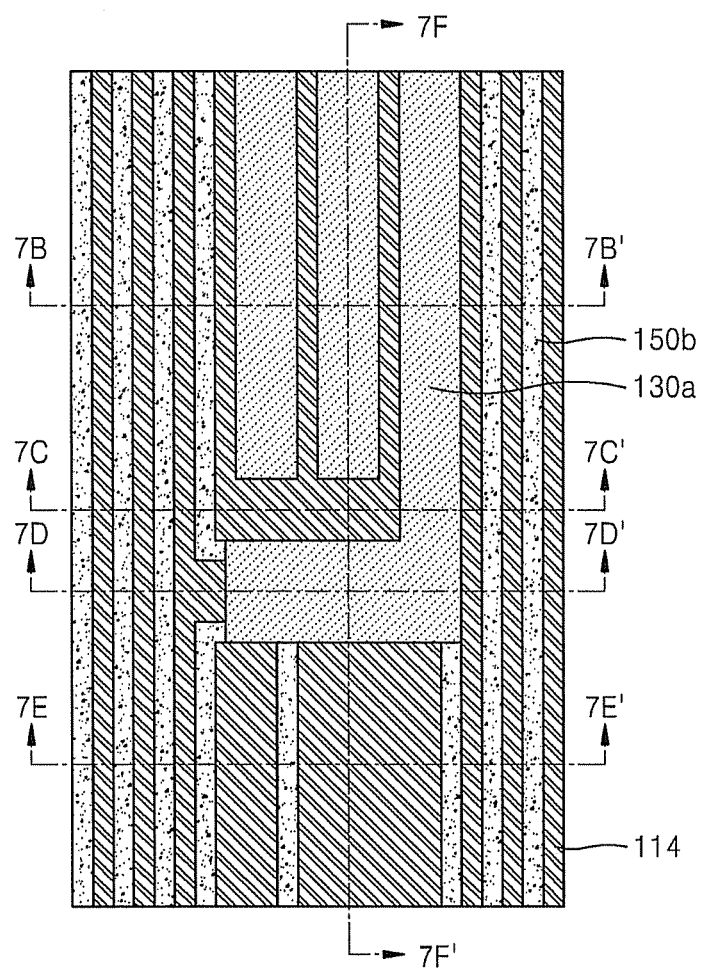
Figure 7B:
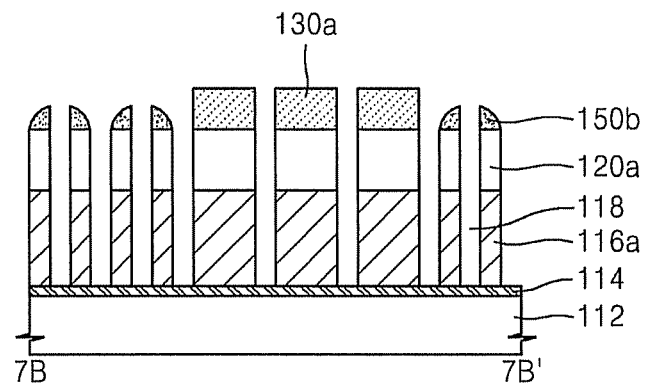
Figure 7C:
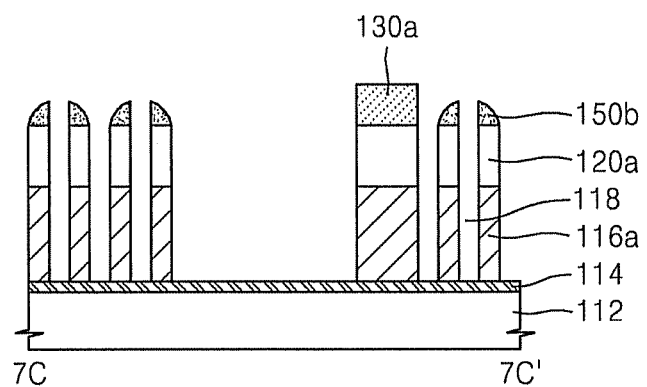
Figure 7D:
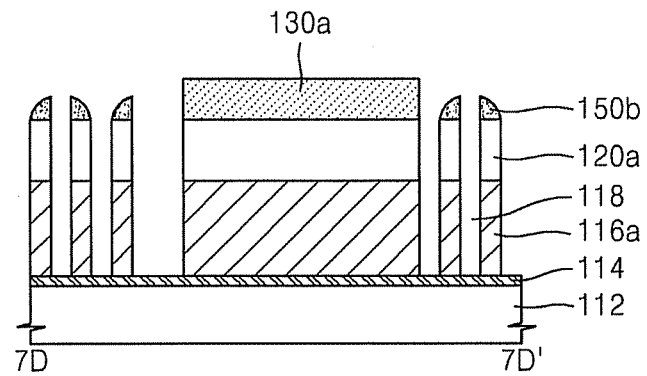
Figure 7E:
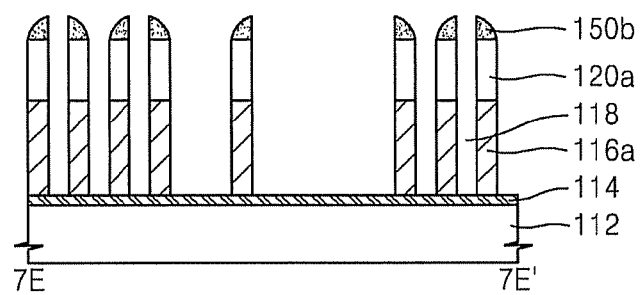
Figure 7F:
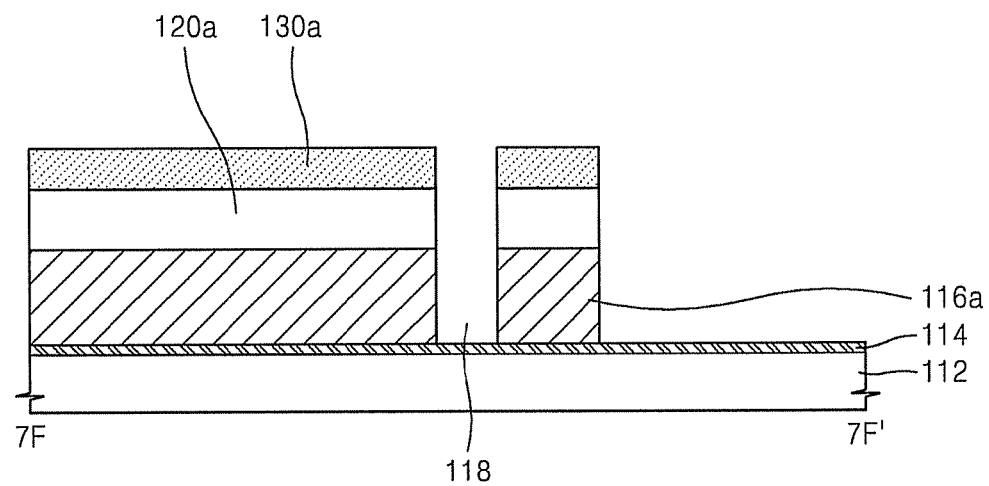

FIGS. 7A through 7F will now be referred to. FIG. 7B is a cross-sectional view taken along a line 7B-7B' of FIG. 7A, and FIG. 7C is a cross-sectional view taken along a line 7C-7C' of FIG. 7A. FIG. 7D is a cross-sectional view taken along a line 7D-7D' of FIG. 7A, FIG. 7E is a cross-sectional view taken along a line 7E-7E' of FIG. 7A, and FIG. 7F is a cross-sectional view taken along a line 7F-7F' of FIG. 7A.

Referring to FIGS. 7A through 7F, the substrate, for example, the sacrificial layer 120, is etched using the spacers 150 and the second masks 130a as etch masks. The etching may be performed from the sacrificial layer 120 to the second insulating layer 116.

As mentioned above, the etch stop layer 114 of the interlayer insulating layer 110 may be used to form damascene metallization. The etching may be performed from the sacrificial layer 120 to the second insulating layer 116 and may stop at the etch stop layer 114.

The etching may be performed using an anisotropic etching method such as reactive ion etching (RIE), inductively coupled plasma (ICP), or transformer coupled plasma (TCP).

If the etching stops at the sacrificial layer 120, the second insulating layer 116 may be additionally etched, thereby forming recesses 118 in a second insulating layer 116a.

As a result of the etching, a considerable part or almost all of the spacers 150 may be removed. As shown in FIGS. 7A through 7E, spacers 150b may remain if only part of the spacers 150 in FIGS. 6A through 6E are removed.

Figure 8A:
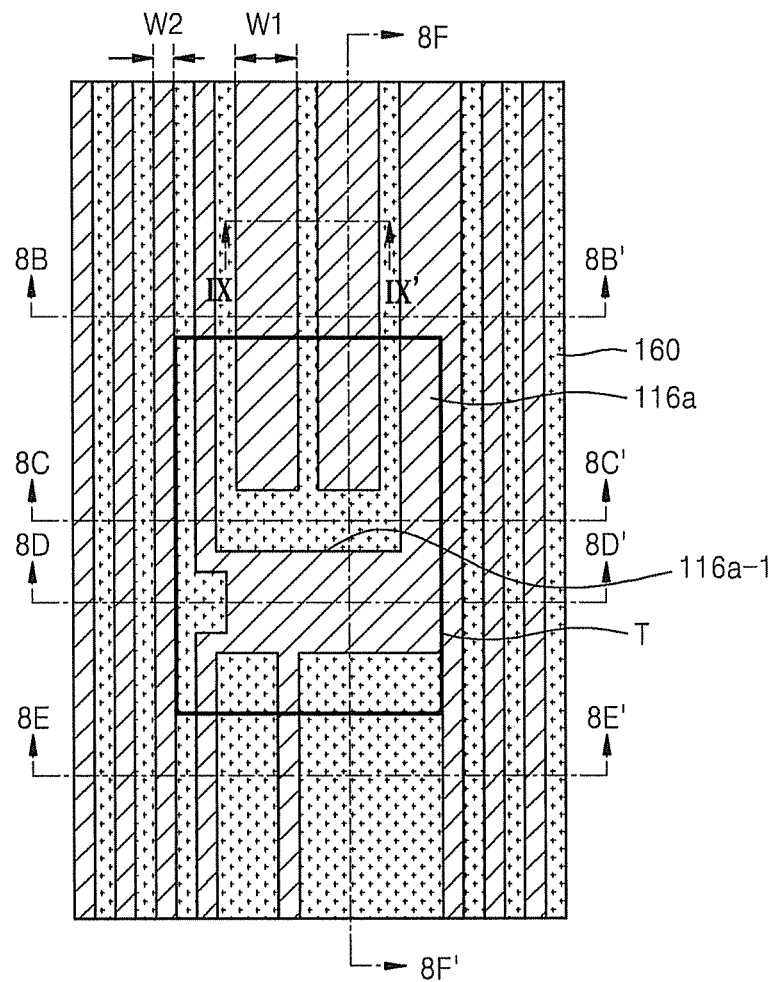
Figure 8B:
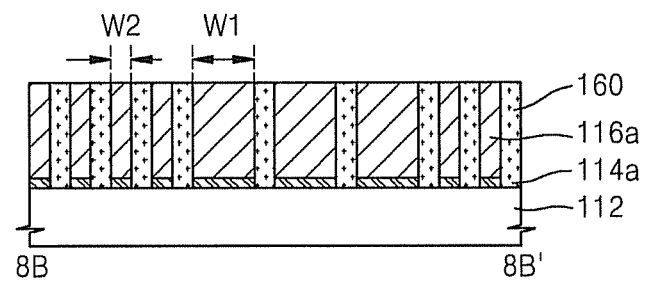
Figure 8C:
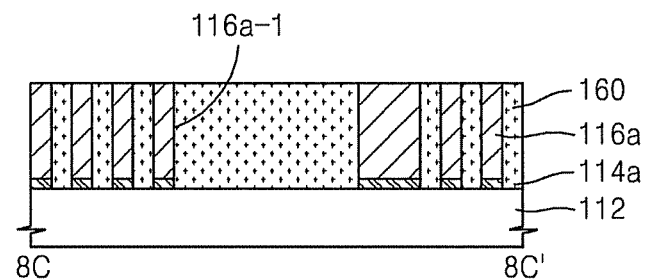
Figure 8D:
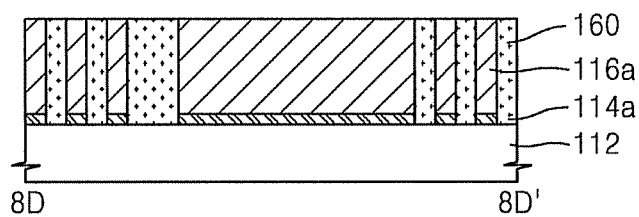
Figure 8E:
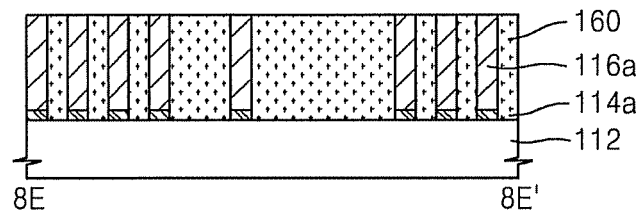
Figure 8F:
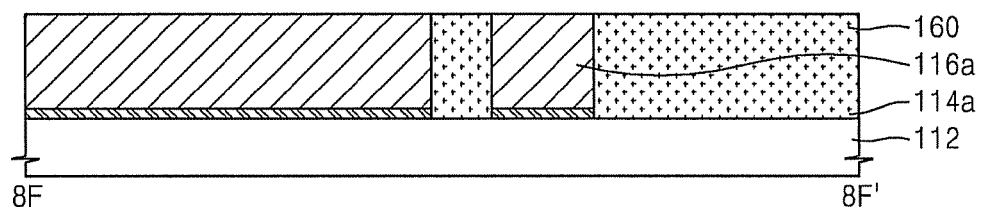

FIGS. 8A through 8F will now be referred to. FIG. 8B is a cross-sectional view taken along a line 8B-8B' of FIG. 8A, and FIG. 8C is a cross-sectional view taken along a line 8C-8C' of FIG. 8A. FIG. 8D is a cross-sectional view taken along a line 8D-8D' of FIG. 8A, FIG. 8E is a cross-sectional view taken along a line 8E-8E' of FIG. 8A, and FIG. 8F is a cross-sectional view taken along a line 8F-8F' of FIG. 8A.

Referring to FIGS. 8A through 8F, exposed parts of the etch stop layer 114 are removed to form the etch stop layer 114a. Here, the second masks 130a may be removed together with the etch stop layer 114. Residual sacrificial layers 120a are removed. A conductive material is buried in the recesses 118 to form dummy lines 160. The conductive material may be copper (Cu) or a Cu alloy.

Referring to FIG. 8A, a plurality of recesses 118 are formed in the second insulating layer 116a in the active line regions 101 and 103, the dummy region 105, and the tap region 107. In particular, two or more recesses, which extend in a direction parallel with the lines of the line-and-space patterns, are formed in the dummy region 105. Also, a recess (bridge recess) 116a-1 is formed to connect the two or more recesses which extend in the direction parallel with the lines of the line-and-space patterns. In particular, the bridge recess 116a-1 may extend in a direction that is not parallel with the lines of the line-and-space patterns, in more detail, in a direction perpendicular to the lines of the line-and-space patterns.

Figure 9:
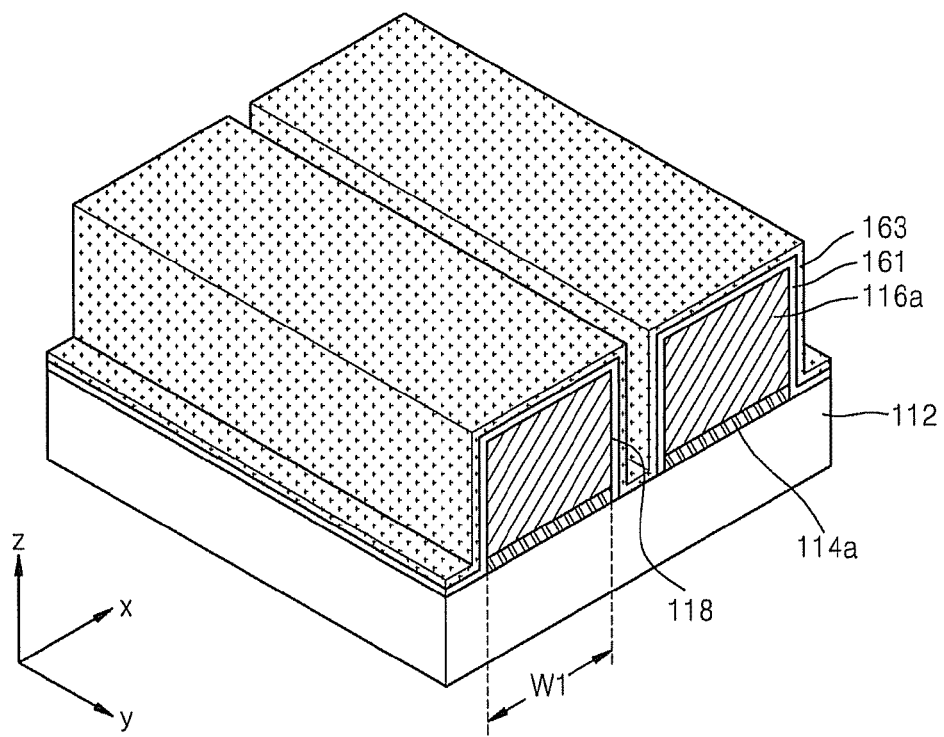
FIG. 9 is a perspective view illustrate forming a barrier layer and a seed layer on a partial cross-sectional view of a part corresponding to line IX-IX' of FIG. 8A.

To bury the conductive material in the recesses 118, thereby forming the dummy lines 160, the residual sacrificial layers 120a are removed as described above. Then, a seed (not shown) may be formed on a whole surface of the substrate, in particular, on inner surfaces of the recesses 118 and an upper surface of the second insulating layer 116a. Before the seed layer is formed, a barrier layer may be formed to interrupt diffusion of conductive metal. FIG. 9 is a perspective view illustrating forming of a barrier layer 161 and a seed layer 163, i.e., a partial cross-sectional view of a part corresponding to IX-IX' of FIG. 8A.

Referring to FIG. 9, the barrier layer 161 and the seed layer 163 are sequentially formed on the inner surfaces of the recesses 118 and the upper surface of the second insulating layer 116a. The barrier layer 161 may be formed of a material such as titanium (Ti), titanium nitride (TiN), titanium silicide nitride (TiSiN), tantalum (Ta), tantalum nitride (TaN), tungsten carbide (WC), tungsten nitride (WN), or the like, but example embodiments are not limited thereto. The barrier layer 161 may be formed to a thickness between about 2.5 nm and about 30 nm using a CVD method or a physical vapor deposition (PVD) method such as sputtering.

The seed layer 163 is formed on the barrier layer 161. The seed layer 163 is formed to provide smooth growth and fine adhesion of a conductive material which is to be buried in the recesses 118. For example, the seed layer 163 may be formed of Cu. The seed layer 163 may be formed to a thickness between about 10 nm and about 100 nm using CVD or PVD.

The conductive material is formed in the recesses 118 and on the second insulating layer 116a. The conductive material may be formed using electroplating. If the conductive material is formed using electroplating, the conductive material is filled in the recesses 118. Also, since the seed layer 163 is formed above the second insulating layer 116a, the conductive material is conformally formed above the second insulating layer 116a. Therefore, an upper surface of the conductive material may be planarized using a method such as chemical mechanical polishing (CMP), etch back, or the like, thereby defining the conductive material in the recesses 118 to form the dummy lines 160.

As shown in FIG. 8B, widths (first widths) W1 of dummy patterns that are bar patterns forming distances among the recesses 118 of a dummy region are wider than widths (second widths) W2 of the cell patterns that are bar patterns forming distances among the recesses 118 of an active line region. In other words, widths W1 of line patterns formed in the dummy region are wider than widths W2 of line patterns formed in the active line region.

To further smoothly bury the conductive material in the recesses 118 using electroplating, conditions under which a current can flow further well may be made. Also, mass transfer towards insides of the recesses 118 is relatively slower than that towards outsides of the recesses 118, and thus a thickness of the conductive material formed at an initial stage inside the recesses 118 is thinner. This relatively restricts a current flow into the recesses 118, and thus a difference in a deposition rate of the conductive material may increase with time.

If upper surfaces of bar-shaped dummy patterns are made wide in the dummy region as shown in FIGS. 8B and 9, a current may smoothly flow in a y direction, thereby increasing an initial growth rate of the conductive material inside the recesses 118 in x and z directions. As a result, a difference between growth rates of insides and outsides of recesses is relieved, and thus the insides of the recesses are smoothly buried without voids.

End parts of the insides of the recesses in a longitudinal direction of the recesses are weaker on the side of step coverage, and thus electroplating may not be conformally performed. Therefore, this side may be required to be considered. In other words, shapes of end parts of dummy lines denoted by reference character T in FIG. 8A are required to be considered. The shapes of the end parts of the dummy lines (i.e., the shapes of the parts denoted by the reference character T of FIG. 8A) greatly depend on shapes of mold mask patterns that are initially designed. The shapes of the end parts of the dummy lines depending on a relation between shapes of mold mask patterns and other design factors in the part T (e.g., a shape of a first mask, a relative position with the first mask, thicknesses of spacers, etc.) will now be described with reference to FIGS. 10A through 10F, 11A through 11F, and 12A through 12F.

Figure 2B:
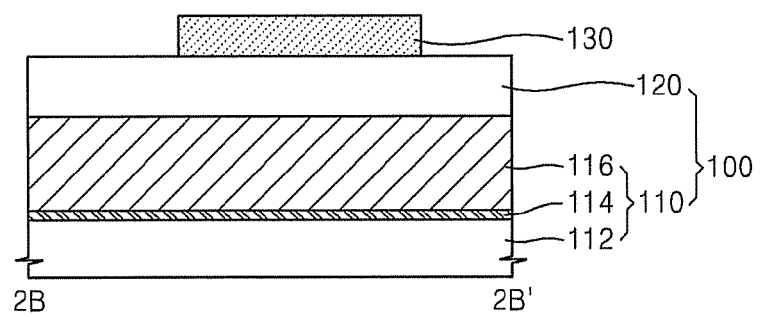
Figure 2C:
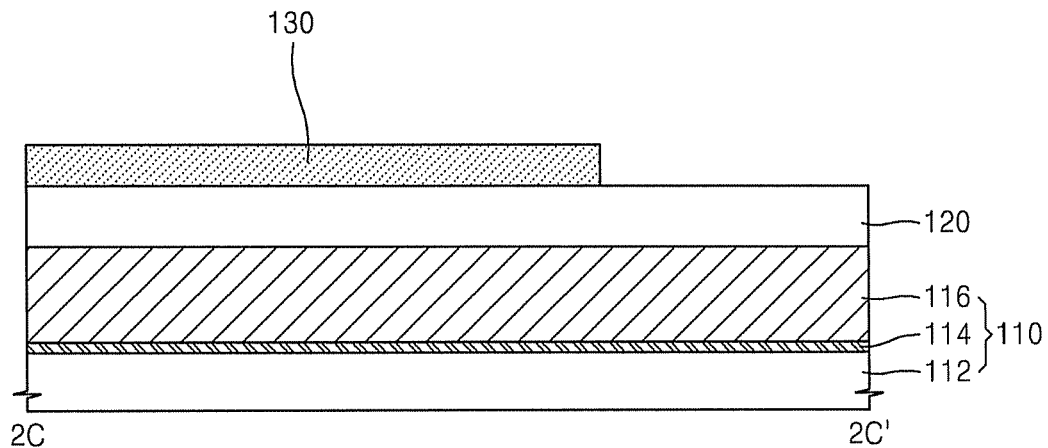
Figure 10A:
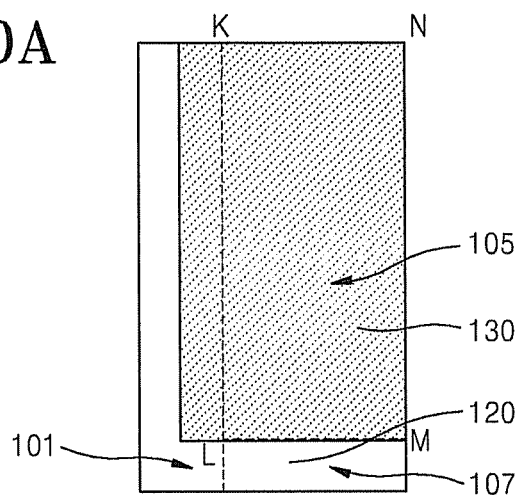
FIGS. 10A to 10F are plan views illustrating a method of fabricating end parts of dummy lines according to example embodiments of inventive concepts.

FIGS. 10A through 10F are plan views illustrating a method of fabricating end parts of dummy lines according to example embodiments of inventive concepts. Referring to FIG. 10A, a substrate includes an active line region 101, a dummy region 105 adjacent to the active line region 101, and a tap region 107 adjacent to both the active line region 101 and the dummy region 105. A first mask 130 is formed on the substrate, in particular, on a sacrificial layer 120 of the substrate. In FIG. 10A, the dummy region 105 indicates a region marked with KLMN. The first mask 130 may cover a whole part of the dummy region 105. Also, the substrate may have a stack structure as shown in FIG. 2B. In other words, the substrate includes an interlayer insulating layer 110 and a sacrificial layer 120 formed on the interlayer insulating layer 110. Here, the interlayer insulating layer 110 includes a first insulating layer 112, an etch stop layer 114 formed on the first insulating layer 112, and a second insulating layer 116 formed on the etch stop layer 114. However, example embodiments of inventive concepts are not limited thereto.

Figure 10B:
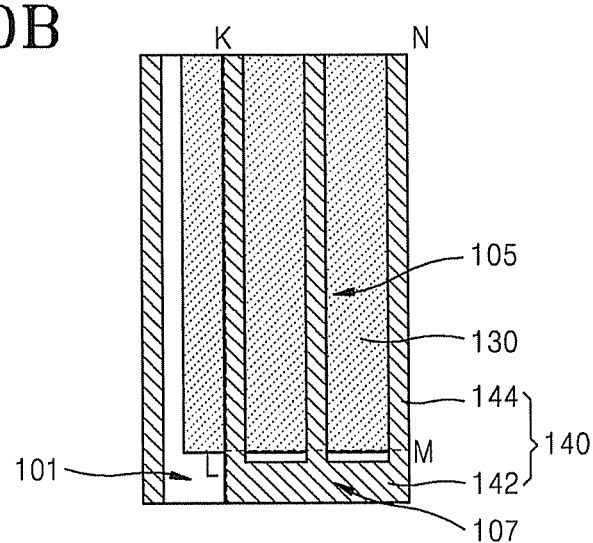

Referring to FIG. 10B, desired (or alternatively predetermined) mold mask patterns 140 are formed on the sacrificial layer 120 of the substrate and the first mask pattern 130. A material and a method for forming the mold mask patterns 140 are as described above, and thus their detailed descriptions will be omitted herein. Both the active line region 101 and the dummy region 105 may have line-and-space sub-patterns, and widths of lines and widths of spaces may be uniform in the active line region 101 and the dummy region 105.

As shown in FIG. 10B, at least one line sub-pattern 144 of the line-and-space sub-patterns of the mold mask patterns 140 may extend to an end LM of the first mask 130. Alternatively, the at least one line sub-pattern 144 of the lines may pass by the end LM of the first mask 130 to further extend.

As shown in FIG. 2A, active line regions 101 and 103 may be adjacent to both sides of the dummy region 105. Also, as shown in FIG. 3A, the mold mask patterns 140 may include crossing sub-patterns 142 which connect the two active line regions 101 and 103 that are adjacent to each other so that the dummy region 105 is interposed between the two active line regions 101 and 103. Also, the crossing sub-patterns 142 may meet the line sub-pattern 144 which passes by the end LM of the first mask 130 to further extend.

Figure 10C:
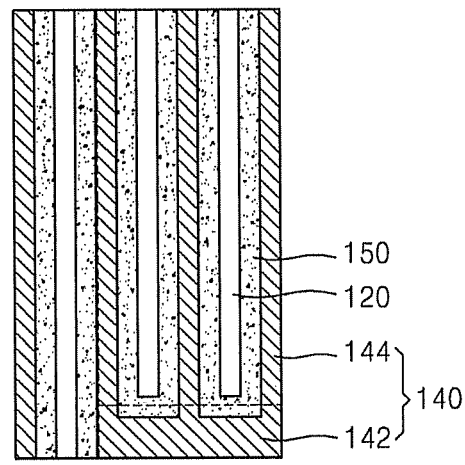

Referring to FIG. 10C, spacers 150 are formed on sidewalls of the mold mask patterns 140. A method of forming the spacers 150 is as described above, and thus its detailed description will be omitted herein. Here, a part of the first mask 130 may be removed simultaneously with the formation of the spacers 150. However, as described above, the formation of the spacers 140 and the removal of the part of the first mask 130 may be simultaneously or separately performed. Second masks 130a (see FIG. 10D) are formed through the removal of the part of the first mask 130.

Figure 10D:
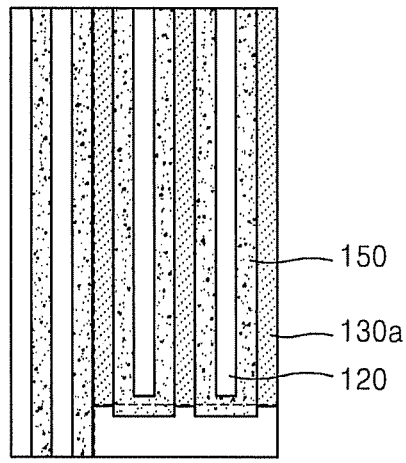

Referring to FIG. 10D, the mold mask patterns 140 are removed. When the mold mask patterns 140 are removed, parts of the sacrificial layer 120 and the second masks 130a positioned underneath the mold mask patterns 140 may be exposed.

Figure 10E:
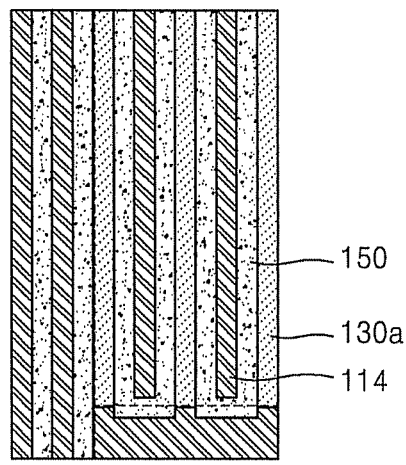

Referring to FIG. 10E, the exposed part of the sacrificial layer 120 and a second insulating layer 116 positioned underneath the sacrificial layer 120 are etched using the spacers 150 and the second masks 130a as etch masks, thereby forming recesses in the second insulating layer 116a.

Figure 10F:
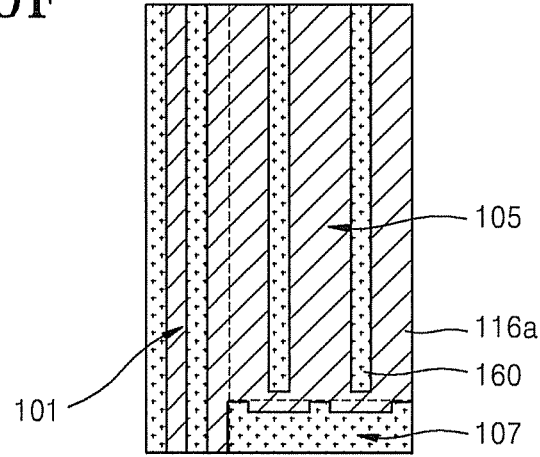

Referring to FIG. 10F, the spacers 150, the second masks 130a, and the sacrificial layer 120 are removed. A conductive material is buried in the recesses formed in the second insulating layer 116a, thereby obtaining dummy lines 160. The method of burying the conductive material in the recesses to form the dummy lines 160 may be an electroplating method that has been described above in detail with reference to FIGS. 8A through 8F and 9, and thus its detailed description will be omitted herein.

As shown in FIGS. 10A through 10F, at least one of lines of the mold mask patterns 140 may extend to at least an end of the first mask 130 (marked with LM in FIG. 10A), thereby obtaining dummy lines 160 having bar-shaped end parts as shown in FIG. 10F.

Figure 11A:
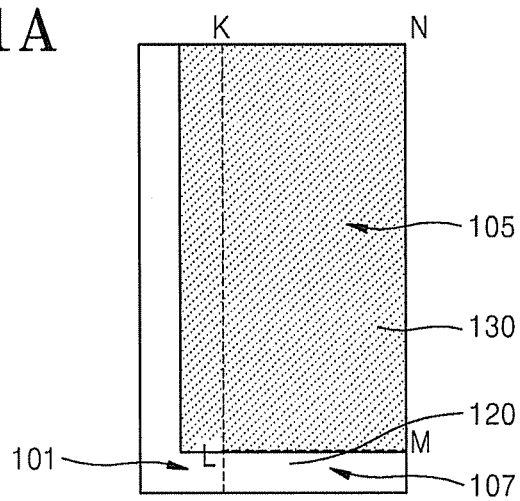
FIGS. 11A to 11F are plan views illustrating a method of fabricating end parts of dummy lines according to example embodiments of inventive concepts.

FIGS. 11A through 11F are plan views illustrating a method of fabricating end parts of dummy lines according to example embodiments of inventive concepts. Referring to FIG. 11A, a substrate includes an active line region 101, a dummy region 105 adjacent to the active line region 101, and a tap region 107 adjacent to both the active line region 101 and the dummy region 105. A first mask 130 is formed on the substrate, in particular, on a sacrificial layer 120 of the substrate. In FIG. 11A, the dummy region 105 refers to a region marked with KLMN. The first mask 130 may cover a whole part of the dummy region 105. Also, the substrate has a stack structure as shown in FIGS. 10A through 10F, and thus its detailed description will be omitted herein. However, example embodiments of inventive concepts are not limited thereto.

Figure 11B:
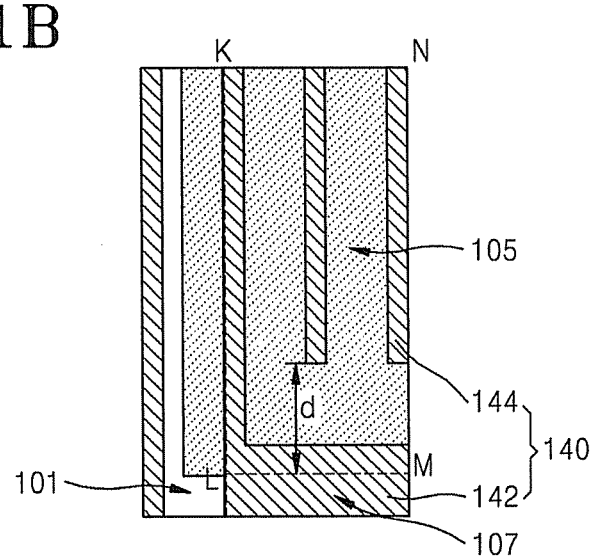

Referring to FIG. 11B, desired (or alternatively predetermined) mold mask patterns 140 are formed on the sacrificial layer 120 of the substrate and the first mask 130. A material and a method for forming the mold mask patterns 140 are as described above, and thus their detailed descriptions will be omitted herein. Both the active line region 101 and the dummy region 105 may have line-and-space sub-patterns, and widths of lines and widths of spaces may be uniform in the active line region 101 and the dummy region 105.

As shown in FIG. 11B, the mold mask patterns 140 may include crossing sub-patterns 142 that are similar to those shown in FIG. 10B. The crossing sub-patterns 142 may connect active line regions 101 and 103 that are positioned beside both sides of the dummy region 105. The crossing sub-patterns 142 may overlap with an end of the first mask 130.

Also, as shown in FIG. 11B, the mold mask patterns 140 may have at least one or more line sub-patterns 144. In particular, an end of at least one of the line sub-patterns 144 of the mold mask patterns 140 of the dummy region 105 may exist on the first mask 130. Here, shapes of dummy lines, which will be obtained later, vary according to a distance d between the end of the line sub-pattern 144 and an end (LM of FIG. 11B) of the first mask 130 positioned in a direction in which the line sub-pattern 144 extends. A method of varying shapes of the dummy lines with the variations in the distance d will be described later.

Figure 11C:
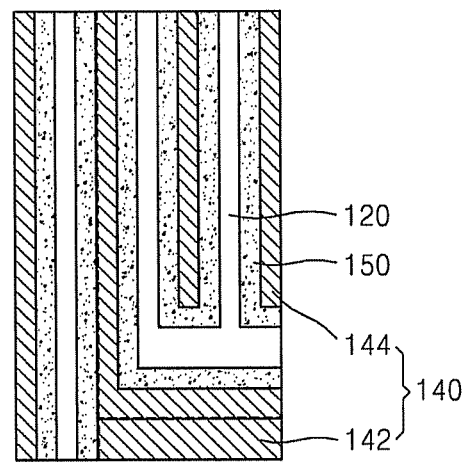

Referring to FIG. 11C, spacers 150 are formed on sidewalls of the mold mask patterns 140. A method of forming the spacers 150 is as described above, and thus its detailed description will be omitted herein. Here, a part of the first mask 130 may be removed simultaneously with the formation of the spacers 150. However, as described above, the formation of the spacers 150 and the removal of the part of the first mask 130 may be simultaneously or separately performed. Second masks 130a are formed through the removal of the part of the first mask 130.

Figure 11D:
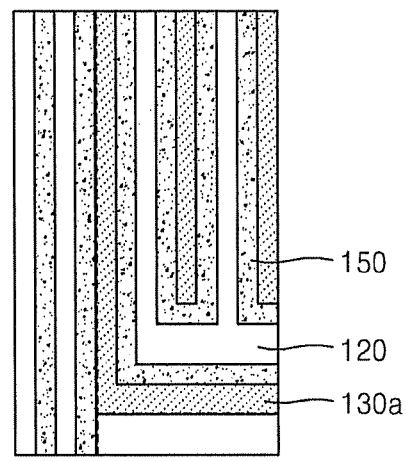

Referring to FIG. 11D, the mold mask patterns 140 are removed. When the mold mask patterns 140 are removed, the sacrificial layer 120 and parts of the second masks 130a positioned underneath the mold mask patterns 140 may be exposed.

Figure 11E:
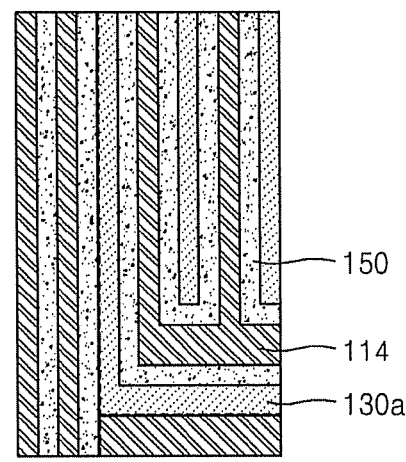

Referring to FIG. 11E, the exposed sacrificial layer 120 and a second insulating layer 116a positioned underneath the sacrificial layer 120 are etched using the spacers 150 and the second masks 130a as etch masks, thereby forming recesses in the second insulating layer 116a.

Figure 11F:
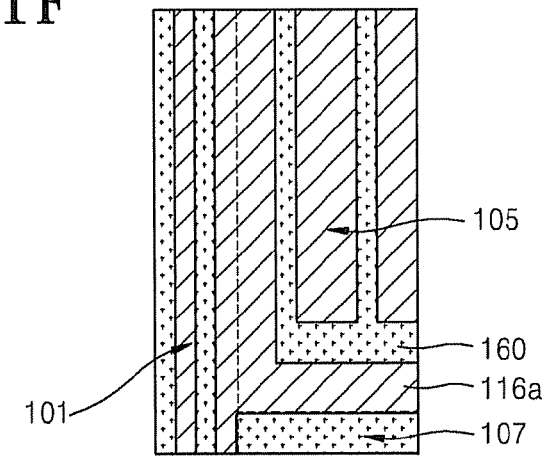

Referring to FIG. 11F, the spacers 150, the second masks 130a, and the sacrificial layer 120 are removed, and a conductive material is buried in the recesses formed in the second insulating layer 116a, thereby obtaining dummy lines 160. A method of burying the conductive material in the recesses to form the dummy lines 160 may be an electroplating method that has been described in detail above with reference to FIGS. 8A through 8F and 9, and thus its detailed description will be omitted herein.

If the distance d between the end of the line sub-pattern 144 and the end LM of the first mask 130 is smaller than a thickness of a spacer material layer, the line sub-pattern 144 and spacers formed on the line sub-pattern 144 extend to the end of the first mask 130. Therefore, the same result as that described with reference to FIGS. 10A through 10F may be obtained.

If the distance d between the end of the line sub-pattern 144 and the end LM of the first mask 130 is greater than the thickness of the spacer material layer in FIG. 11B, lines of a conductive material adjacent to each other may be connected to each other as shown in FIG. 11F. In other words, two or more dummy lines, which extend in a direction parallel with the line sub-pattern 144, and at least one dummy line, which connects the two or more dummy lines and is not parallel with the line sub-pattern 144, may be formed in the dummy region 105.

If the distance d between the end of the line sub-pattern 144 and the end LM of the first mask 130 is greater than two times the thickness of the spacer material layer in FIG. 11B, although crossing sub-patterns 142 are opposite to the end of the line sub-pattern 144, a structure (i.e., a bridge structure) in which adjacent lines of a conductive material (e.g., dummy lines 160) are connected to each other may be obtained as shown in FIG. 11F.

Figure 12A:
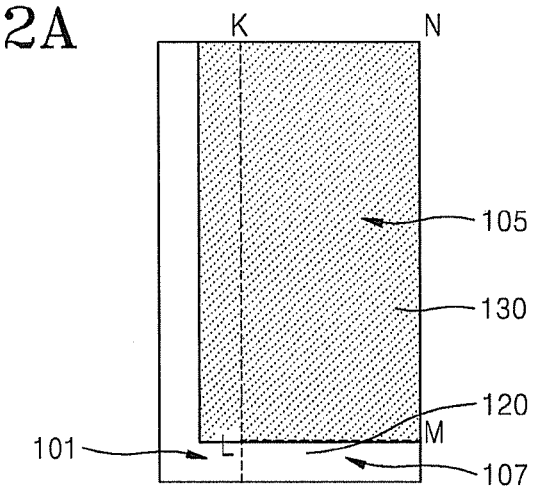
FIGS. 12A through 12F are plan views illustrating a method of fabricating end parts of dummy lines according to example embodiments of inventive concepts.

FIGS. 12A through 12F are plan views illustrating a method of fabricating end parts of dummy lines according to example embodiments of inventive concepts. Referring to FIG. 12A, a substrate includes an active line region 101, a dummy region 105 adjacent to the active line region 101, and a tap region 107 adjacent to both the active line region 101 and the dummy region 105. A first mask 130 is formed on the substrate, in particular, a sacrificial layer 120 of the substrate. In FIG. 12A, the dummy region 105 refers to a region marked with KLMN. The first mask 130 may cover a whole part of the dummy region 105. Also, the substrate has a stack structure as shown in FIGS. 10A through 10F, and thus its detailed description will be omitted herein. However, example embodiments of inventive concepts are not limited thereto.

Figure 12B:
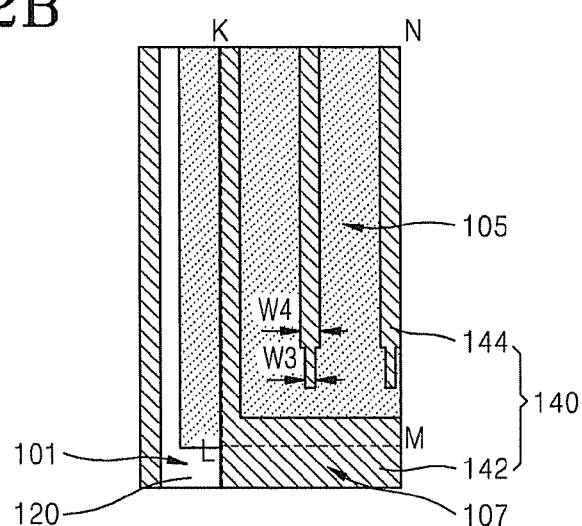

Referring to FIG. 12B, desired (or alternatively predetermined) mold mask patterns 140 are formed on the sacrificial layer 120 of the substrate and the first mask 130. A material and a method for forming the mold mask patterns 140 are as described above, and thus their detailed descriptions will be omitted herein. Both the active line region 101 and the dummy region 105 may have line-and-space sub-patterns, and widths of lines and widths of spaces may be uniform in the active line region 101 and the dummy region 105. However, widths of ends of the lines may be narrower than those of other parts of the lines. In other words, as shown in FIG. 12B, a line sub-pattern 144 may include an end part having a width W3 and a body part having a width W4. Here, the width W3 may be narrower than the width W4. In other words, the width of the end part of the line sub-pattern 144 may be narrower than the width W4 of another part of the line sub-pattern 144.

Also, the mold mask patterns 140 may include crossing sub-patterns 142 as shown in FIG. 12B. The crossing sub-patterns 142 may connect active line regions 101 and 103 that are positioned beside both sides of the dummy region 105. The crossing sub-patterns 142 may overlap with an end of the first mask 130.

Figure 12C:
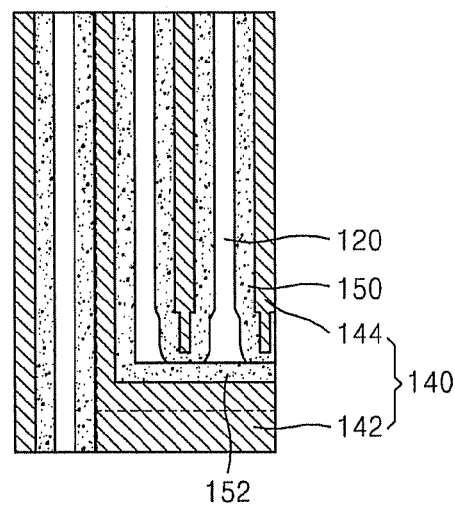

As shown in FIG. 12B, two or more adjacent line sub-patterns 144 may be provided, wherein widths of ends of the adjacent line sub-patterns 144 are narrower than those of another parts of the line sub-patterns 144. If distances between the crossing sub-patterns 142 and the line sub-patterns 144 are within a desired (or alternatively predetermined)

range, e.g., two times a thickness of a spacer material layer, spacers 150 formed on sidewalls of the line sub-patterns 144 meet spacers 150 formed on sidewalls of the crossing sub-patterns 142 as shown in FIG. 12C. Here, a spacer commonly meeting spacers formed on sidewalls of the two adjacent line sub-patterns 144 is defined as a bridge spacer 152. In particular, as shown in FIG. 12C, the bridge spacer 152 is a part of spacers of the crossing sub-patterns 142.

A method of forming the spacers 150 is as described above, and thus its detailed description will be omitted herein. Here, a part of the first mask 130 may be removed simultaneously with the formation of the spacers 150. However, as described above, the formation of the spacers 150 and the removal of the part of the first mask 130 may be simultaneously or separately performed. Second masks 130a are formed through the removal of the part of the first mask 130.

Figure 12D:
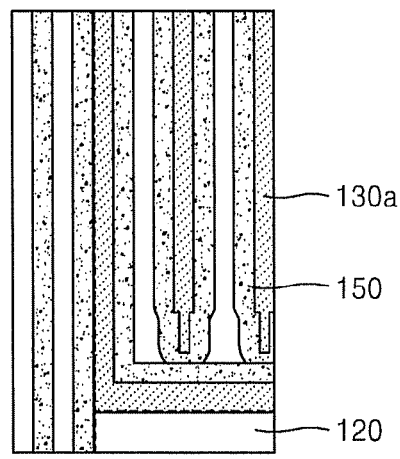

Referring to FIG. 12D, the mold mask patterns 140 are removed. If the mold mask patterns 140 are removed, the sacrificial layer 120 and parts of the second masks 130a positioned underneath the mold mask patterns 140 may be exposed.

Figure 12E:
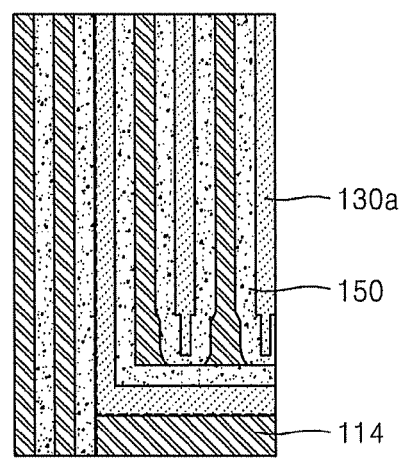

Referring to FIG. 12E, the exposed sacrificial layer 120 and a second insulating layer 116a positioned underneath the sacrificial layer 120 are etched using the spacers 150 and the second masks 130a as etch masks, thereby forming recesses in the second insulating layer 116a.

Figure 12F:
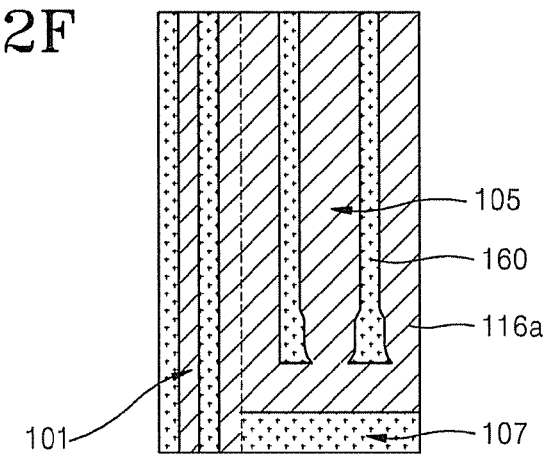

Referring to FIG. 12F, the spacers 150 and the second masks 130a are removed, and a conductive material is buried in the recesses formed in the second insulating layer 116a, thereby forming dummy lines 160. A method of burying the conductive material in the recesses to form the dummy lines 160 may be an electroplating method that has been described in detail above with reference to FIGS. 8A through 8F and 9, and thus its detailed description will be omitted herein.

Ends of the dummy lines 160 shown in FIG. 12F has tap shapes. In other words, when the dummy lines 160 are formed, widths of the recesses corresponding to end parts of the dummy lines 160 are wider than widths of the recesses corresponding to body parts of the dummy lines 160. Therefore, the conductive material is easily filled. As shown in FIG. 12F, shapes of taps constituting the end parts of the dummy lines 160 may be appropriately adjusted according to shapes of the mold mask patterns 130, distances between the line sub-patterns 144 and the crossing sub-patterns 142, etc.

To form the taps, the spacers 150 of the crossing sub-patterns 142 meet the spacers 150 of the line sub-patterns 144 as shown in FIG. 12C. Although the crossing sub-patterns 142 do not directly meet the line sub-patterns 144, the spacers 150 of the crossing sub-patterns 142 may meet the spacers 150 of the line sub-patterns 144. Alternatively, the line sub-patterns 144 may extend to meet the crossing sub-patterns 142 so that the spacers of the line sub-patterns 144 meet the spacers 150 of the crossing sub-patterns 142.

As shown in FIGS. 10A through 12F, ends of the line sub-patterns 144 of the dummy lines 160 may be variously changed, thereby obtaining the dummy lines 160 that are formed at a high quality without voids.

Figure 13A:
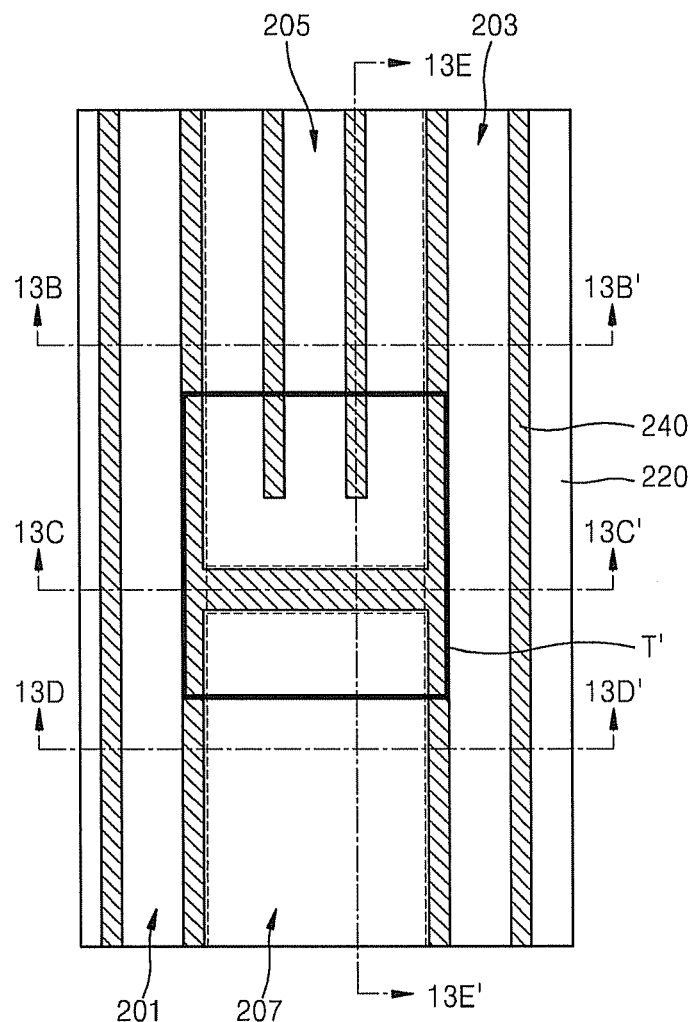
FIGS. 13A through 19E are views illustrating a method of forming a micropattern according to example embodiments of inventive concepts.
Figure 13B:
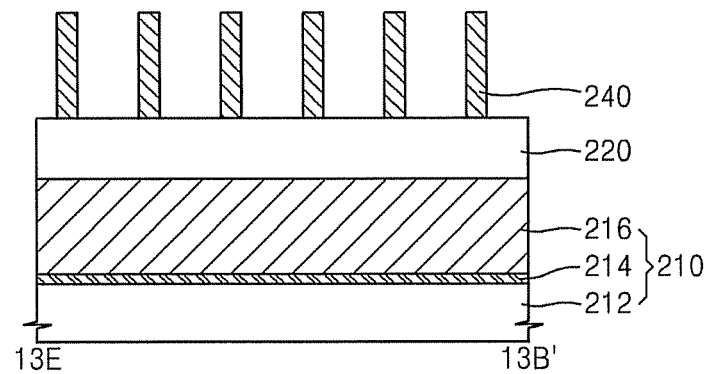
Figure 13C:
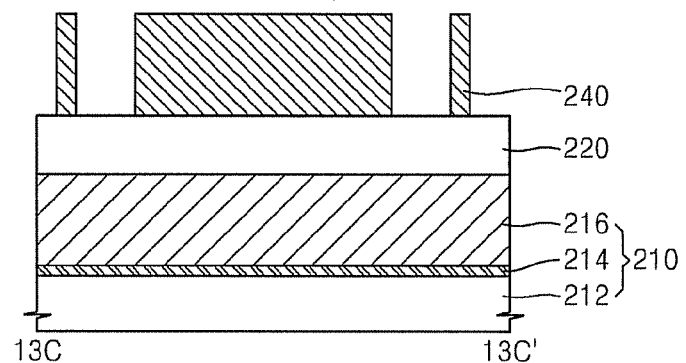
Figure 13D:
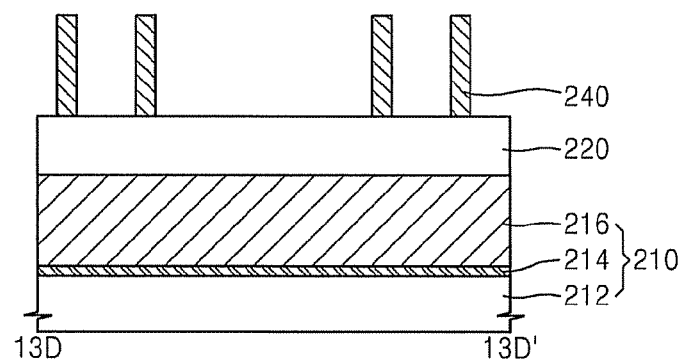
Figure 13E:
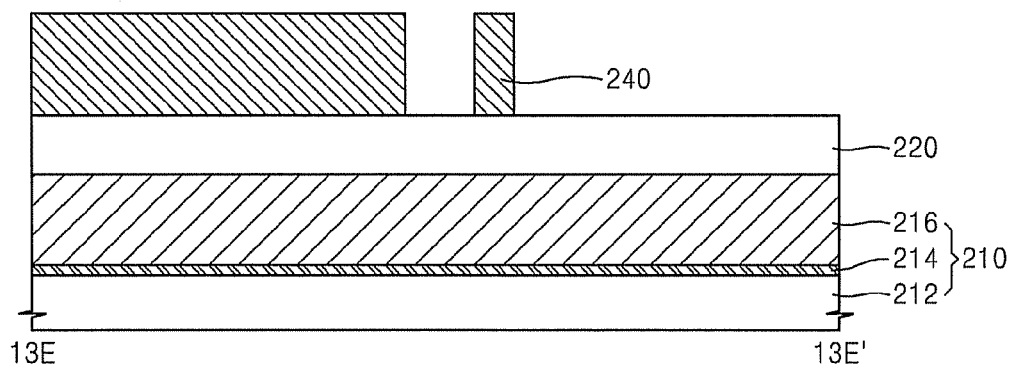

FIGS. 13A through 19E are views illustrating a method of forming a micropattern according to example embodiments of inventive concepts. FIGS. 13A through 13E will be first referred to. FIG. 13B is a cross-sectional view taken along a line B-B' of FIGS. 13A, and 13C is a cross-sectional view taken along a line C-C' of FIG. 13A. FIG. 13D is a cross-sectional view taken along a line of D-D' of FIG. 13A, and FIG. 13E is a cross-sectional view taken along a line E-E' of FIG. 13A.

Referring to FIGS. 13A through 13E, mold mask patterns 240 are formed on a substrate.

The substrate has a stack structure in which several types of material layers are stacked. For example, the substrate includes a first insulating layer 212, an etch stop layer 214 formed on the first insulating layer 212, and a second insulating layer 216 formed on the etch stop layer 214. However, example embodiments of inventive concepts are not limited thereto, and thus the substrate may further include a sacrificial layer 220 formed on the second insulating layer 216 and various types of semiconductor substrates disposed underneath the first insulating layer 212. Also, a stack structure of the first insulating layer 212, the etch stop layer 214 formed on the first insulating layer 212, and the second insulating layer 216 formed on the etch stop layer 214 may be an interlayer insulating layer 210.

The substrate includes active line regions 201 and 203, a dummy region 205, and a tap region 207 on a main surface thereof. In FIG. 13A, for convenience, the dummy region 205 is interposed between the two active line regions 201 and 203. The tap region 207 is adjacent to the dummy region 205 to form taps of other lines such as common source lines (CSLs), but example embodiments of inventive concepts are not limited thereto. The active line regions 201 and 203 and the tap region 207 are conceptually separated from one another for convenience and thus may not be physically separated from one another.

Materials and methods for forming the first insulating layer 212, the second insulating layer 216, the etch stop layer 214, and the sacrificial layer 220 are as described with reference to FIGS. 2A through 2F, and thus their detailed descriptions will be omitted herein.

The interlayer insulating layer 210 may operate as an interlayer insulating layer with respect to a semiconductor substrate (not shown) formed in a lower part.

As will be described later, the mold mask patterns 240 may be designed so that spacers are formed on sidewalls of the mold mask patterns 240, and a material layer formed underneath the spacers is patterned using the spacers. In particular, the mold mask patterns 240 may include line-and-space sub-patterns, but the line-and-space patterns are merely an example, and thus example embodiments of inventive concepts are not limited thereto.

In the line-and-space sub-patterns of the mold mask patterns 240, a ratio between widths of lines and widths of spaces may be between about 1:2.5 and about 1:3. If the ratio between the widths of the lines and the widths of the spaces is 1:3, a conformal material layer having the same thickness as the widths of the lines may be coated and anisotropically etched, thereby obtaining spacers. Also, a lower layer may be etched using the spacers as masks, thereby obtaining lower patterns having uniform widths and distances. If the ratio between the widths of the lines and the widths of the spaces is 1:2.5, a conformal material layer having a thinner thickness than the widths of the lines may be coated and anisotropically etched, thereby obtaining lower patterns having uniform widths and distances.

In particular, when the line-and-space sub-patterns are formed, widths and distances of lines may be uniform in the active line regions 201 and 203 and the dummy region 205. In other words, widths of cells of the line-and-space sub-patterns may be the same, and spaces that are distances of the cells may be the same.

A material and a method for forming the mold mask patterns 240 are as described with reference to FIGS. 3A through 3F, and thus their detailed descriptions will be omitted herein.

Figure 14A:
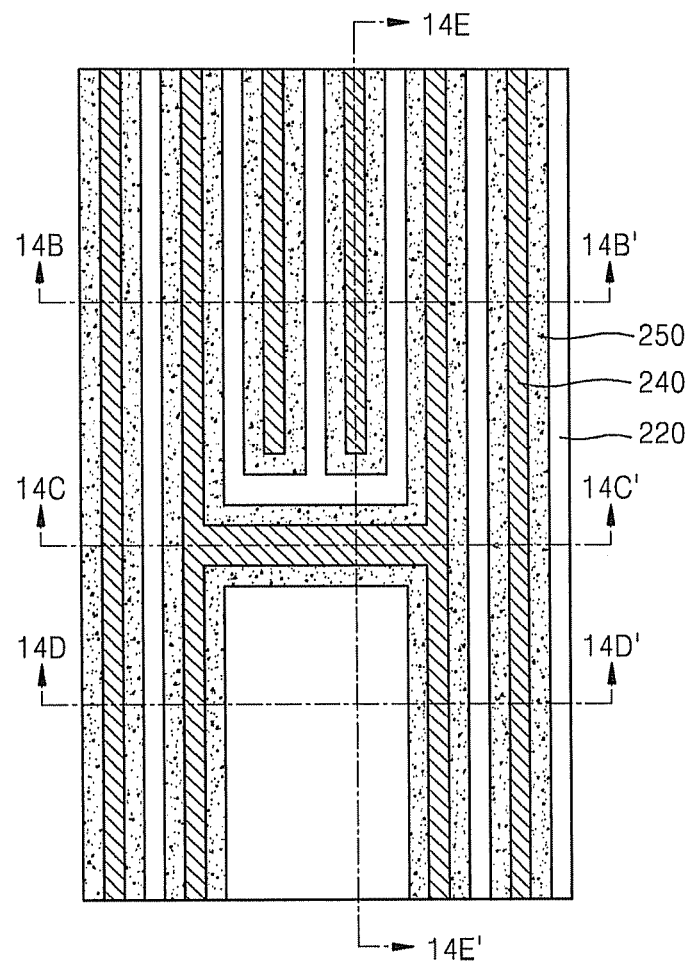
Figure 14B:
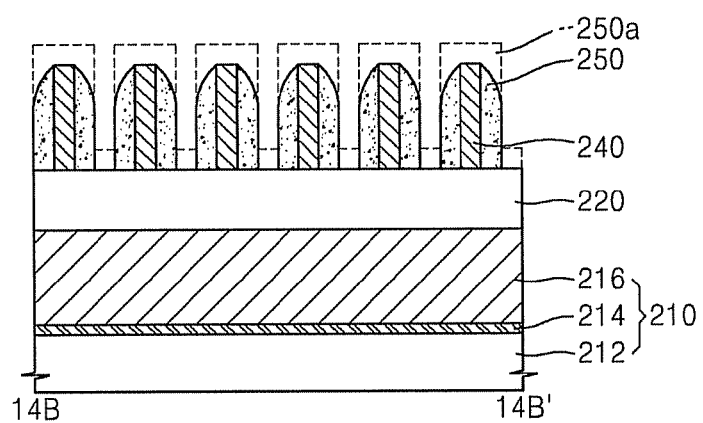
Figure 14C:
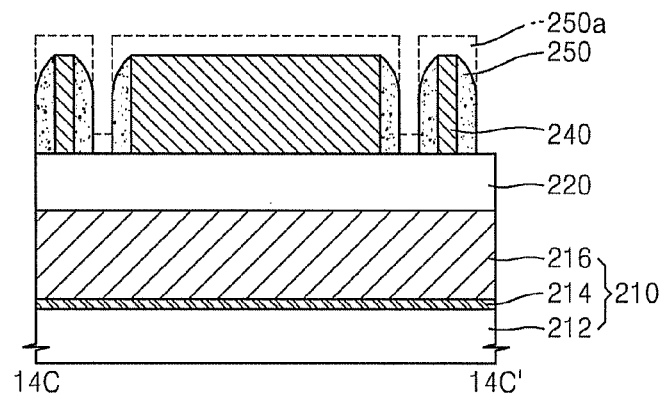
Figure 14D:
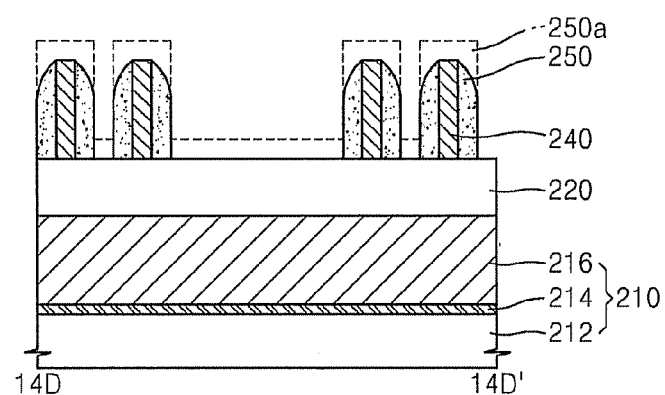
Figure 14E:
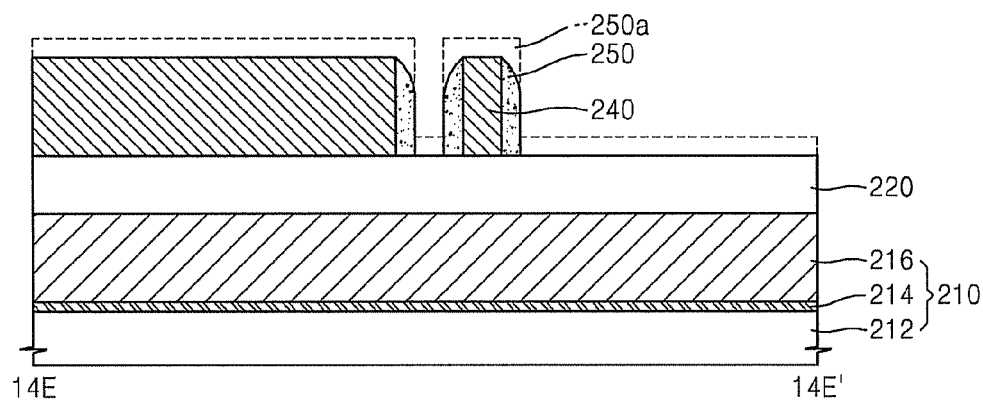

FIGS. 14A through 14E will now be referred to. FIG. 14B is a cross-sectional view taken a line B-B' of FIG. 14A, and FIG. 14C is a cross-sectional view taken along a line C-C' of FIG. 14A. FIG. 14D is a cross-sectional view taken along a line D-D' of FIG. 14A, and FIG. 14E is a cross-sectional view taken along a line E-E' of FIG. 14A.

Referring to FIGS. 14A through 14E, spacers 250 are formed on sidewalls of the mold mask patterns 240. As described with reference to FIGS. 4A through 4F, a spacer material layer 250a is conformally coated on the substrate and whole surfaces of the mold mask patterns 240 and then anisotropically etched, thereby forming the spacers 250.

The spacer material layer 250a may be formed of a material having etch selectivity with the sacrificial layer 220 and the mold mask patterns 240, e.g., may be formed of silicon oxide. The spacer material layer 250a may be selected to have etch selectivity with a first mask that will be described later. The spacer material layer 250a may be formed using a well-known method, e.g., a method such as ALD or CVD.

As mentioned above, a thickness of the spacer material layer 250a may be appropriately adjusted in consideration of the ratio between the widths of the lines of the line-and-space sub-patterns of the mold mask patterns 240 and the widths of the spaces of the line-and-space sub-patterns. For example, if the ratio between the widths of the lines and the widths of the spaces is 1:3, the thickness of the spacer material layer 250a may be the same as the widths of the lines. For example, if the ratio between the widths of the lines and the widths of the spaces is 1:2.5, the thickness of the spacer material layer 250a may be about 0.75 times the widths of the lines.

Figure 15A:
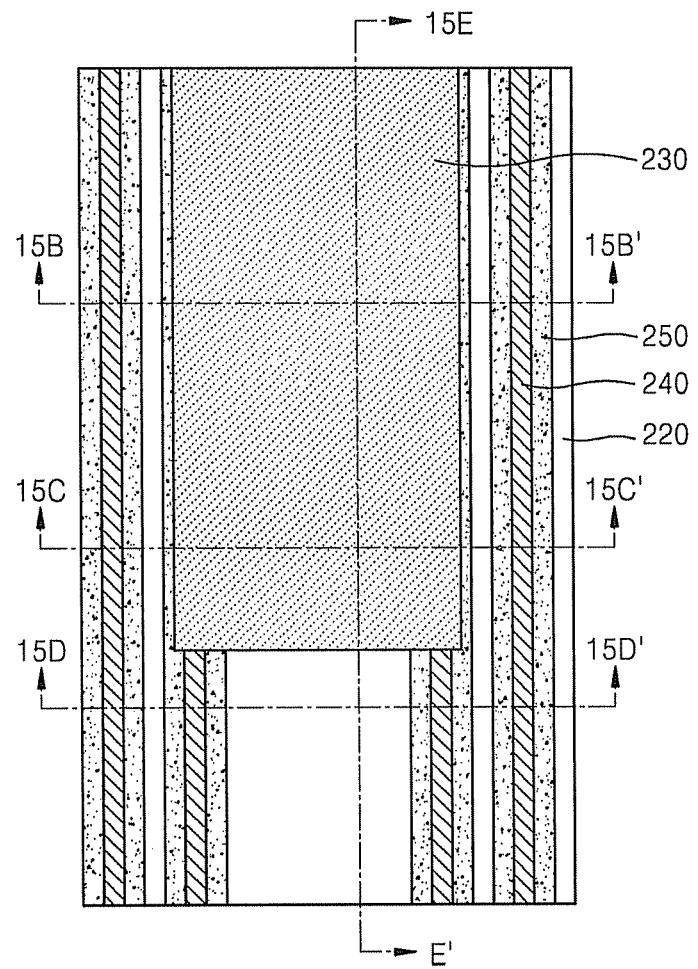
Figure 15B:
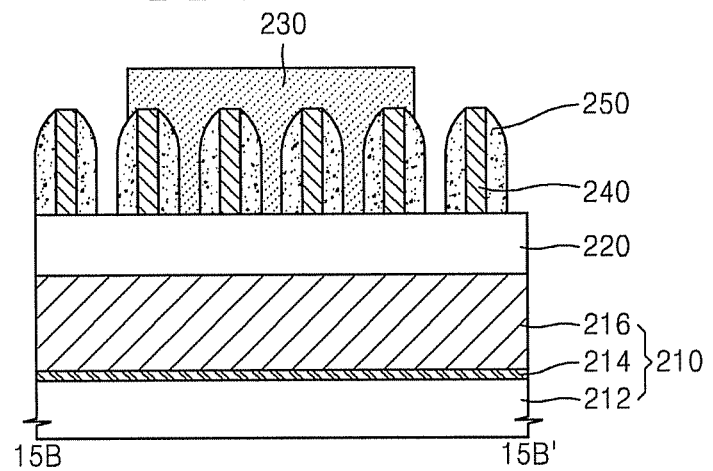
Figure 15C:
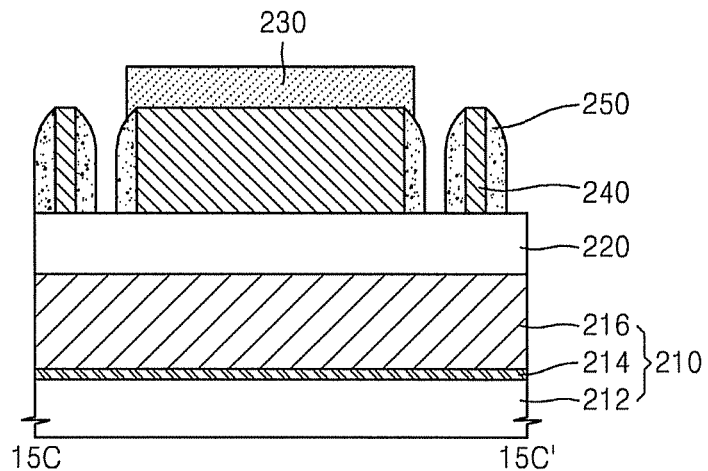
Figure 15D:
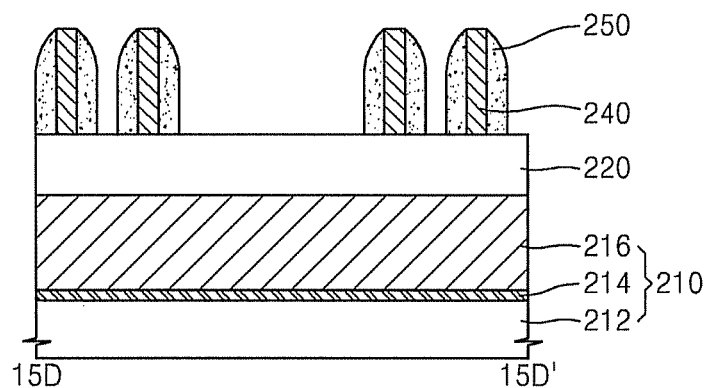
Figure 15E:
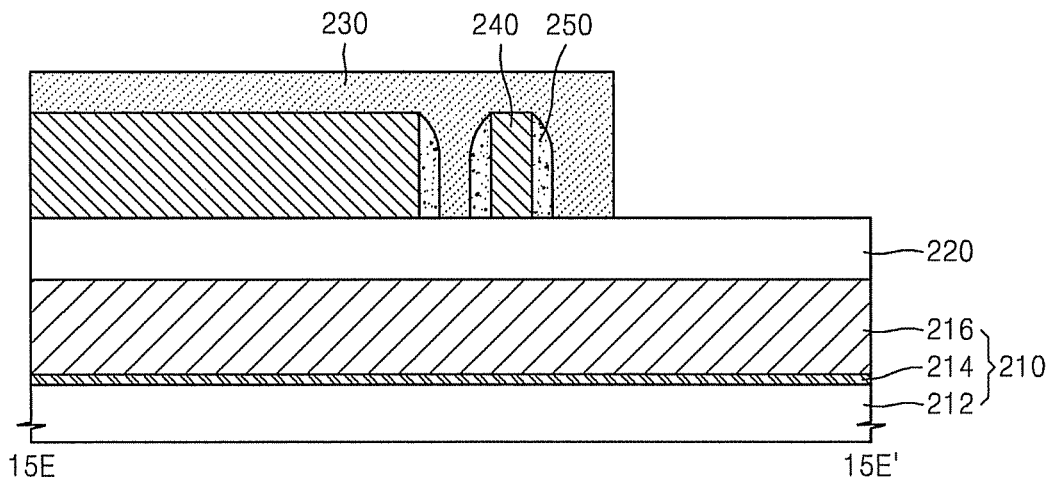

FIGS. 15A through 15E will now be referred to. FIG. 15B is a cross-sectional view taken a line B-B' of FIG. 15A, and FIG. 15C is a cross-sectional view taken along a line C-C' of FIG. 15A. FIG. 15D is a cross-sectional view taken along a line D-D' of FIG. 15A, and FIG. 15E is a cross-sectional view taken along a line E-E' of FIG. 15A.

Referring to FIGS. 15A through 15E, a first mask 230 is formed to cover the mold mask patterns 240 and the spacers 250 of the dummy region 205. The first mask 230 may be formed using a photolithography method. The first mask 230 may be formed of silicon nitride but is not limited thereto.

Figure 15F:
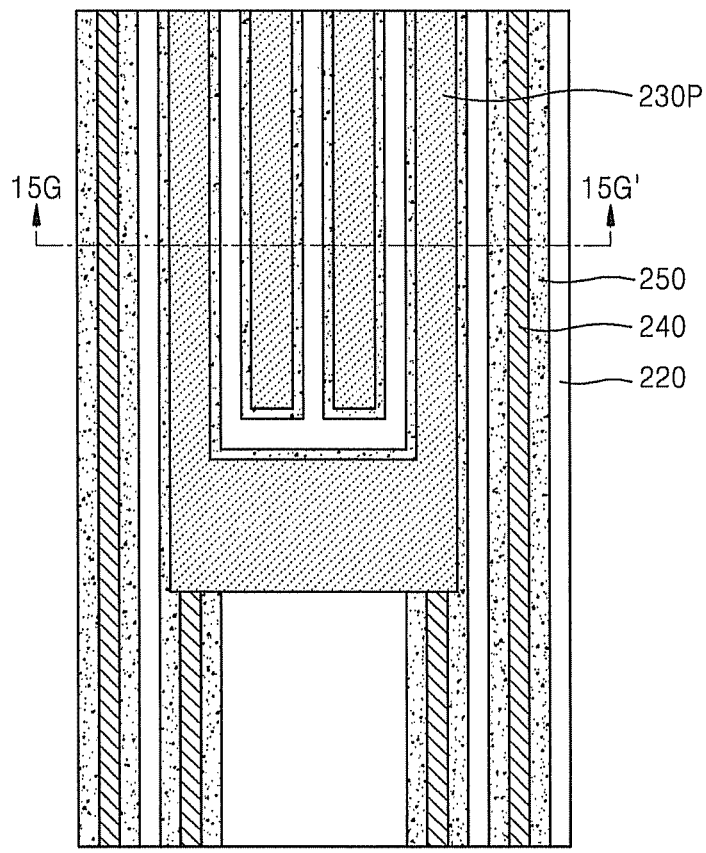
Figure 15G:
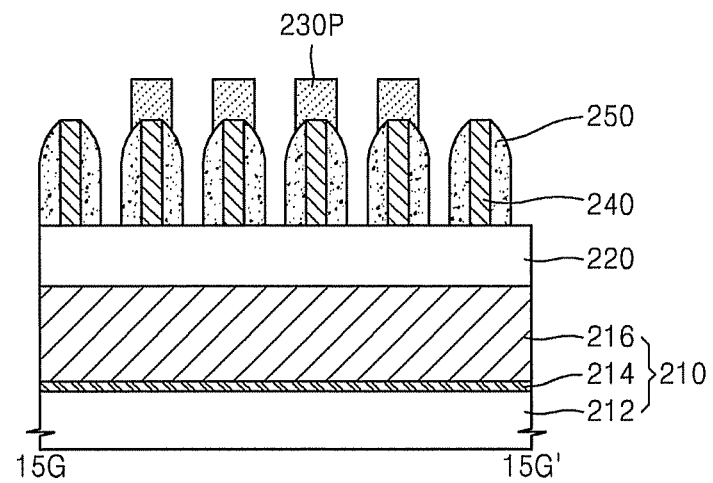

The first mask 230 may cover a whole part of the dummy region 205. In FIG. 15A, the first mask 230 covers the whole part of the dummy region 205. However, since the first mask 230 is to protect the mold mask patterns 240 in a desired (or alternatively predetermined) region (in the dummy region 205 in FIG. 15A), the first mask 230 may have an arbitrary pattern which protects the mold mask patterns 240. FIGS. 15F and 15G illustrate a first mask according to example embodiments of inventive concepts. FIG. 15G is a cross-sectional view taken along a line of G-G' of FIG. 15G.

Referring to FIG. 15F, a first mask 230p is formed merely on mold mask patterns 240 of a dummy region 205. In other words, the first mask 230p may be formed on one mold mask pattern 240 and spacers 250 formed on both sides of the mold mask pattern 240. Although the first mask 230p is formed as described above, the same result as that of forming the first mask 230 may be obtained in a subsequent process as shown in FIGS. 15A through 15E.

Figure 16A:
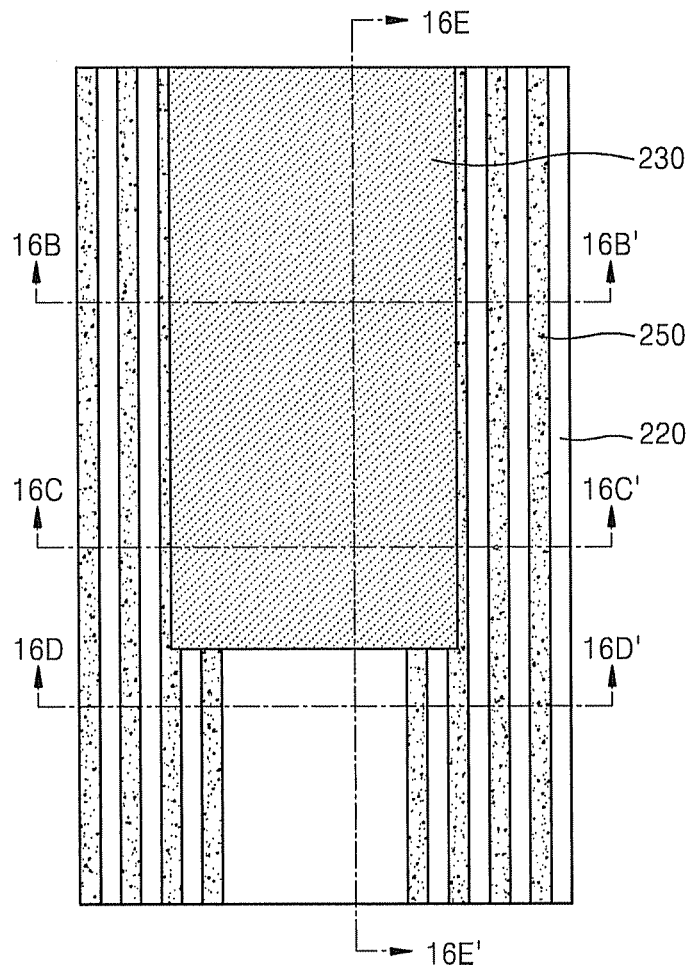
Figure 16B:
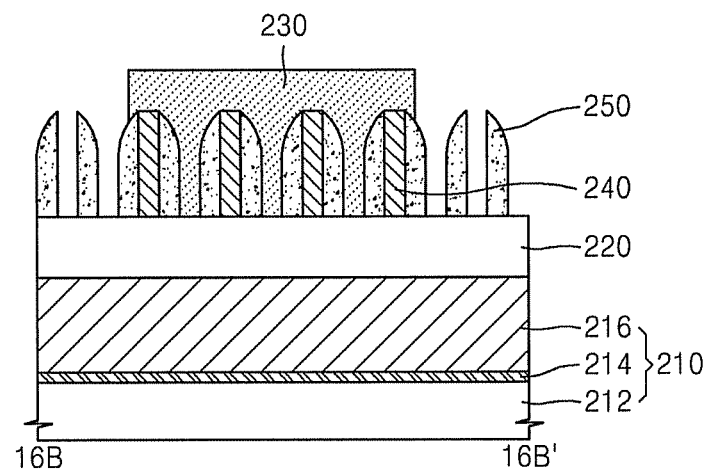
Figure 16C:
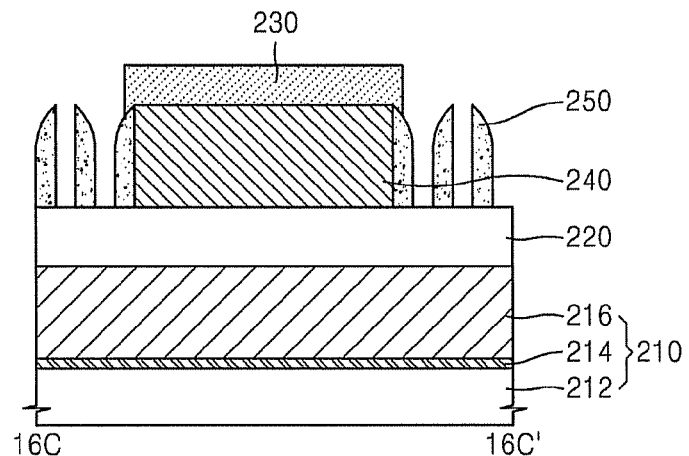
Figure 16D:
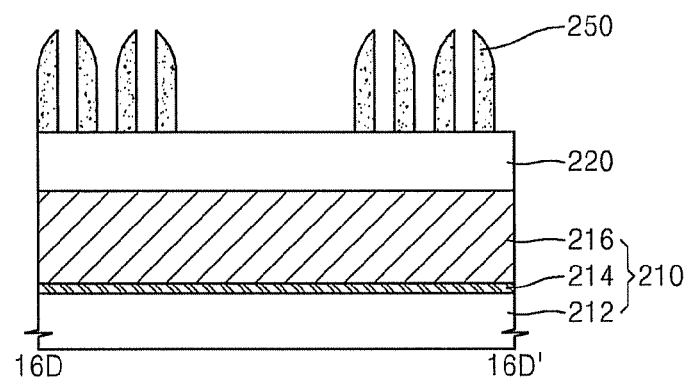
Figure 16E:
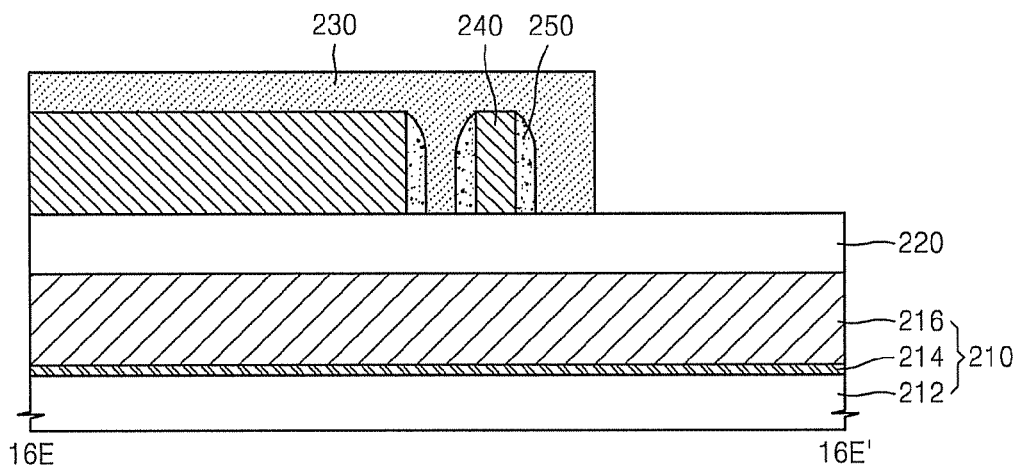

FIGS. 16A through 16E will now be referred to. FIG. 16B is a cross-sectional view taken a line B-B' of FIG. 16A, and FIG. 16C is a cross-sectional view taken along a line C-C' of FIG. 16A. FIG. 16D is a cross-sectional view taken along a line D-D' of FIG. 16A, and FIG. 16E is a cross-sectional view taken along a line E-E' of FIG. 16A.

Referring to FIGS. 16A through 16E, the mold mask patterns 240 exposed through the first mask 230 are removed. The mold mask patterns 240 may be ACLs or spin-on hard masks and may be formed of a carbon-based material as mentioned above. If the mold mask patterns 240 are formed of the carbon-based material, the mold mask patterns 240 may be almost completely removed through heating without a great thermal budget. Here, since a temperature of the heating is between about 100° C. and about 300° C., i.e., is not high, merely the mold mask patterns 240 may be removed without damaging other structures. However, the mold mask patterns 240 positioned underneath the first mask 230 are not removed and remain.

As shown in FIGS. 16A through 16E, the spacers 250 formed on sidewalls of the mold mask patterns 240 remain. Therefore, if the spacers 250 are used as etch masks, the spacers 250 may transfer a doubled pattern density to their lower parts.

Figure 17A:
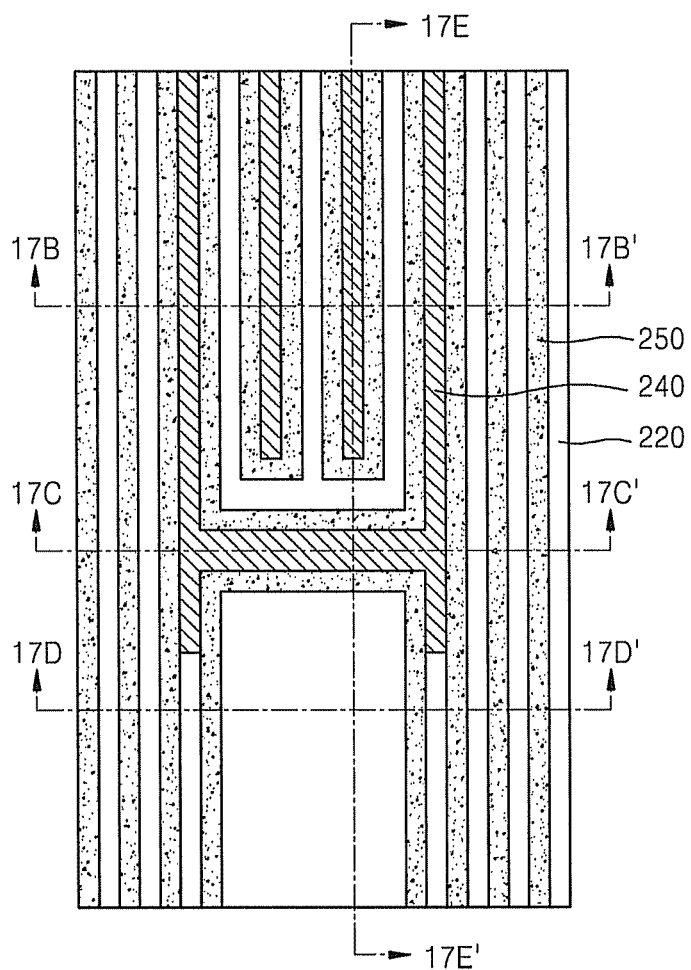
Figure 17B:
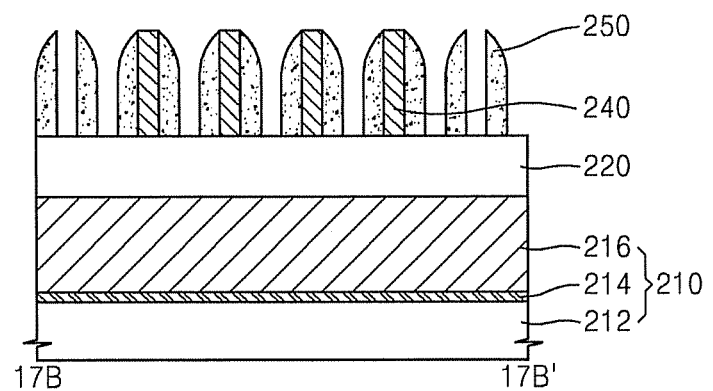
Figure 17C:
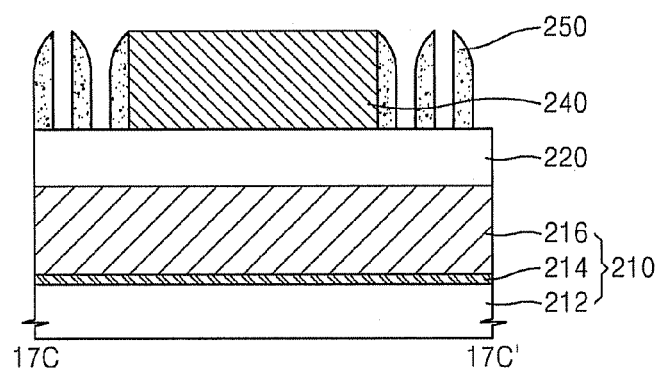
Figure 17D:
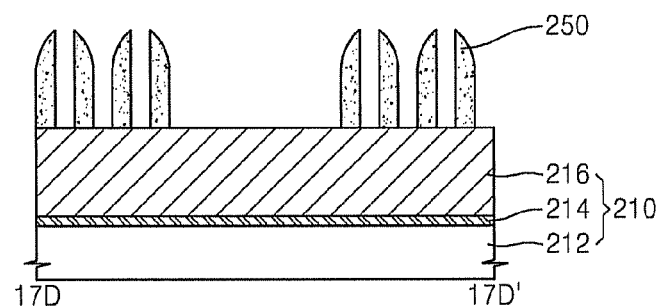
Figure 17E:
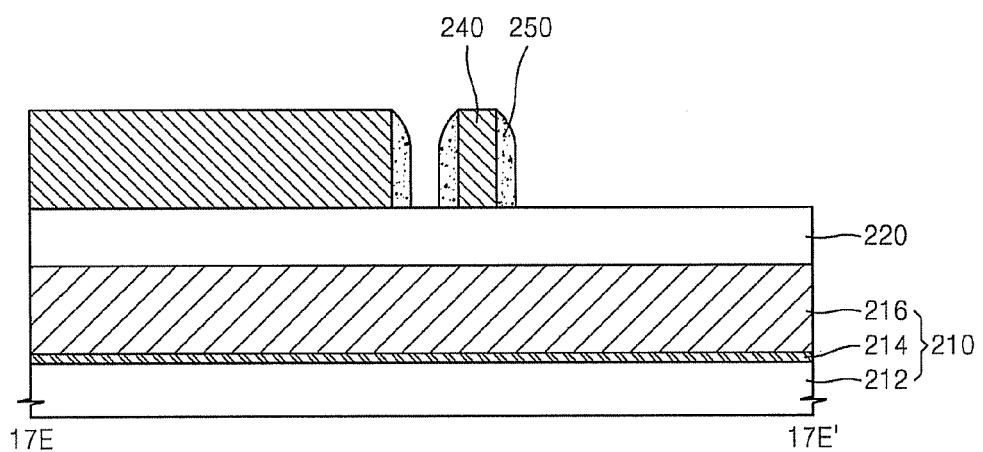

FIGS. 17A through 17E will now be referred to. FIG. 17B is a cross-sectional view taken along a line B-B' of FIG. 17A, and FIG. 17C is a cross-sectional view taken along a line C-C' of FIG. 17A. FIG. 17D is a cross-sectional view taken along a line D-D' of FIG. 17A, and FIG. 17E is a cross-sectional view taken along a line E-E' of FIG. 17A.

Referring to FIGS. 17A through 17E, the first mask 230 is removed. The first mask 230 has etch selectivity with the remaining mold mask patterns 240, the spacers 250, and the sacrificial layer 220 and thus may be selectively removed. If the first mask 230 is removed, the spacers 250 and some of the mold mask patterns 250 protected underneath the first mask remain.

Figure 18A:
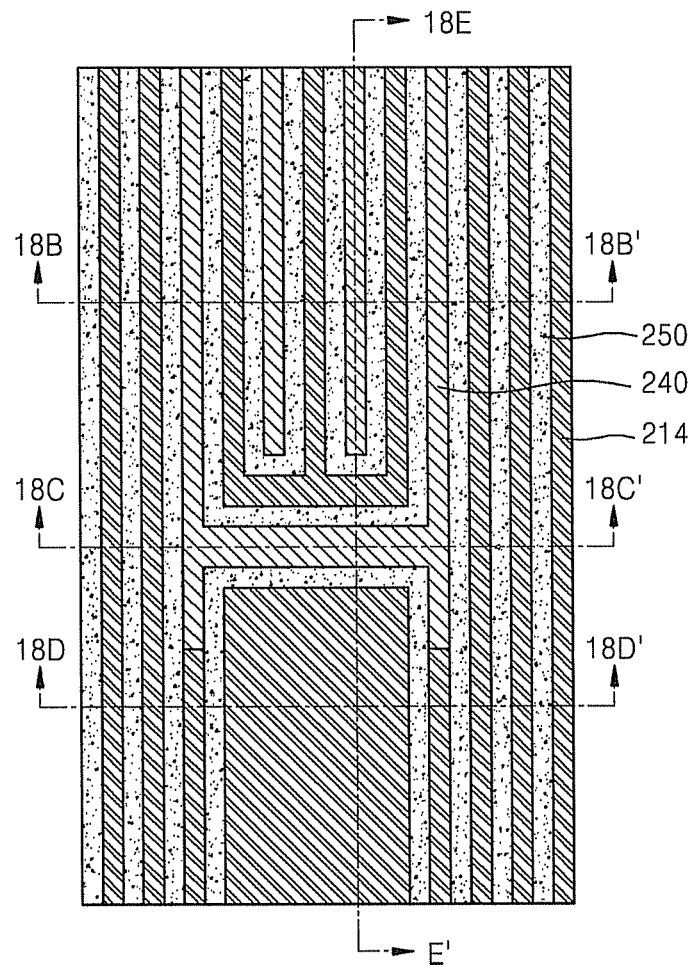
Figure 18B:
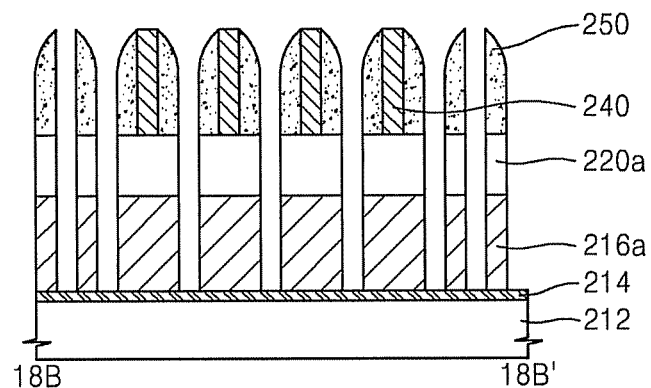
Figure 18C:
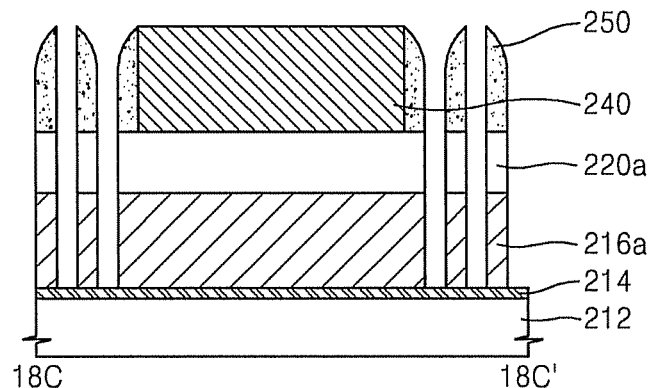
Figure 18D:
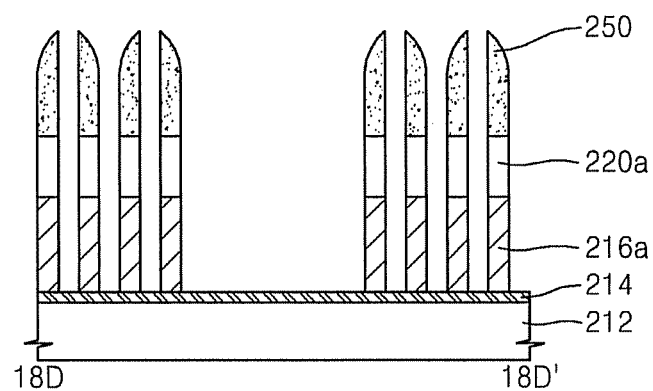
Figure 18E:
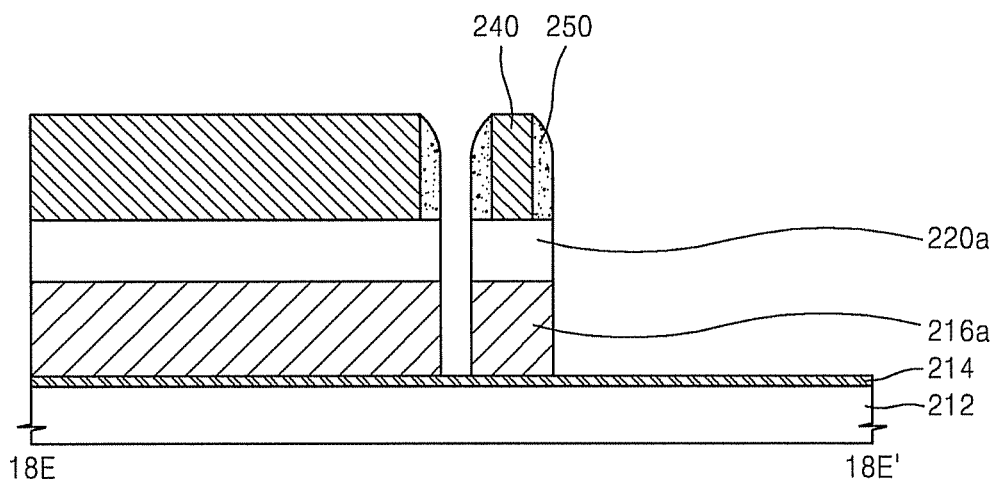

FIGS. 18A through 18E will now be referred to. FIG. 18B is a cross-sectional view taken along a line B-B' of FIG. 18A, and FIG. 18C is a cross-sectional view taken along a line C-C' of FIG. 18A. FIG. 18D is a cross-sectional view taken along a line D-D' of FIG. 18A, and FIG. 18E is a cross-sectional view taken along a line E-E' of FIG. 18A.

Referring to FIGS. 18A through 18E, the sacrificial layer 220 is etched using the mold mask patterns 240 and the spacers 250 as etch masks. In particular, the etching may be performed from the sacrificial layer 220 to the second insulating layer 216.

As described with reference to FIGS. 7A through 7F, the etch stop layer 214 may be used to form damascene metallization. The etching may be performed from the sacrificial layer 220 to the second insulating layer 216 but may not be performed to the etch stop layer 214.

Figure 19A:
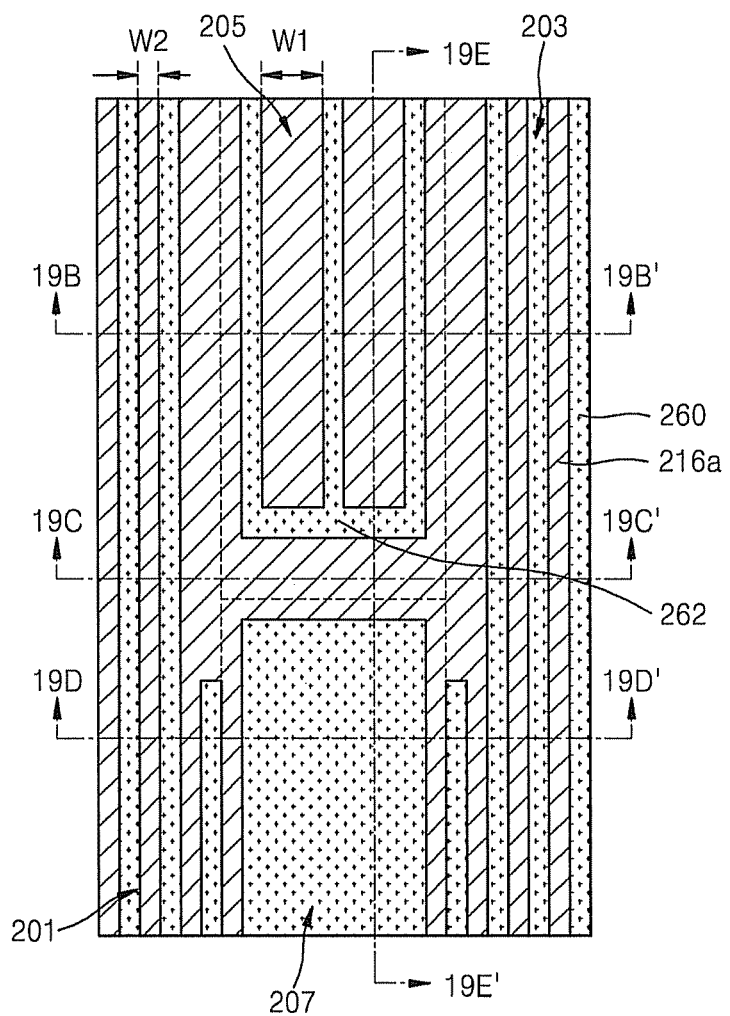
Figure 19B:
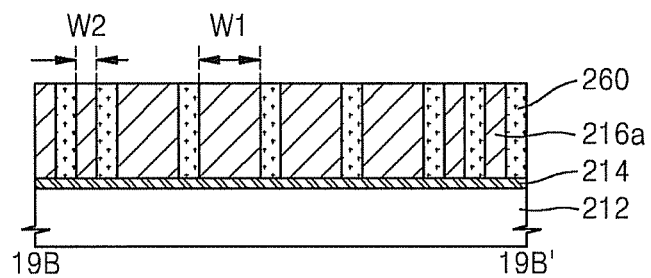
Figure 19C:
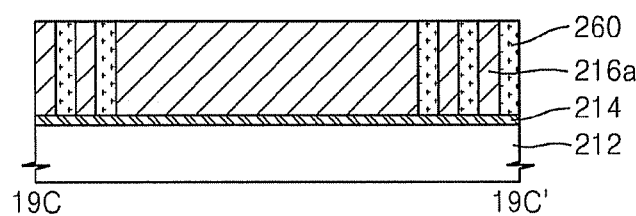
Figure 19D:
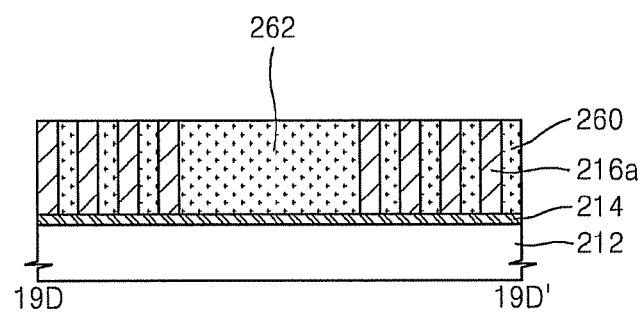
Figure 19E:
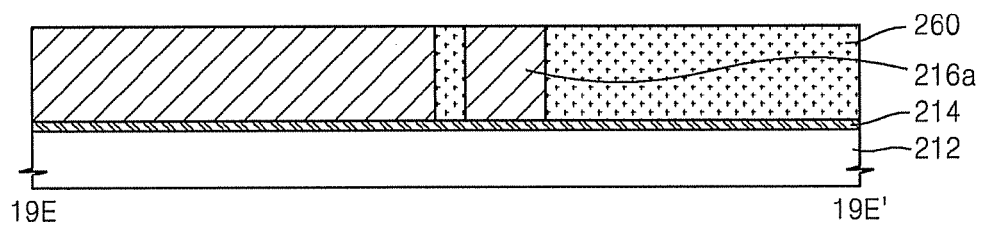

FIGS. 19A through 19E will now be referred to. FIG. 19B is a cross-sectional view taken along a line B-B' of FIG. 19A, and FIG. 19C is a cross-sectional view taken along a line C-C' of FIG. 19A. FIG. 19D is a cross-sectional view taken along a line D-D' of FIG. 19A, and FIG. 19E is a cross-sectional view taken along a line E-E' of FIG. 19A.

Referring to FIGS. 19A through 19E, a conductive material is buried in recesses formed in the second insulating layer 216, thereby obtaining dummy lines 260.

To bury the conductive material in the recesses formed in the second insulating layer 216, the remaining mold mask patterns 240, the spacers 250, and the sacrificial layer 220 may be first removed. Thereafter, as described with reference to FIGS. 8A through 8F and 9, a conductive material such as Cu may be buried in the recesses using a method such as electroplating or electroless plating. If the electroplating is used, the conductive material may be deposited on an upper surface of the second insulating layer 216 and may be defined in the recesses through a method such as CMP or etch back.

As shown in FIGS. 19A and 19B, widths W1 of dummy patterns of the dummy region 205 are wider than widths W2 of cell patterns of the active line regions 201 and 203. In other words, widths of bars of the dummy region 205 are wider than widths of bars of the active line regions 201 and 203. Since the widths W1 of the bars of the dummy region 205 are widely formed, high-quality dummy lines may be formed in recess parts adjacent to the bars without voids as described in the previous embodiments.

In example embodiments, shapes of end parts of the dummy lines 260 may be variously changed. As shown in FIGS. 13A, 14A, and 15A, the mold mask patterns 240 of the dummy region 205 may include line-and-space sub-patterns. Also, if an end of at least one of lines of the line-and-space sub-patterns is positioned underneath the first mask 230, ends of the dummy lines 260 of FIG. 19A may be formed within the dummy region 205. In particular, if end parts of two adjacent lines of the line-and-space sub-patterns are positioned underneath the first mask 230, end parts of three or more dummy lines 260 may be formed as shown in FIG. 19A and may be or may not be connected to one another through a bridge 262 as shown in FIGS. 19A and 19D.

Also, if a distance between an end part of at least one of the lines and an end part of the first mask 230 positioned in a direction in which the at least one line extends is greater than a thickness of a spacer material layer 250a, two or more ends of the dummy lines 260 may be connected to one another through the bridge 262.

The mold mask patterns 240 may have crossing sub-patterns which cross the dummy region 205 to connect two active line regions 201 and 203.

Figure 20:
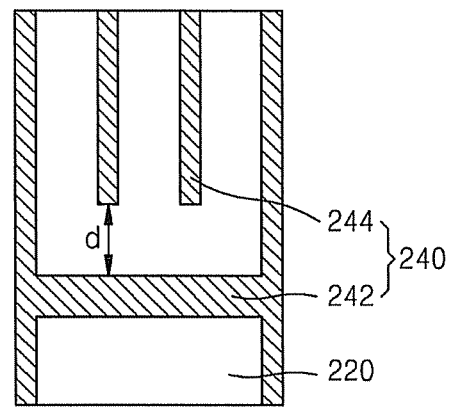
FIGS. 20, 21A, and 21B are views illustrating end parts of dummy lines formed according to a relative position between cross sub-patterns and lines corresponding to a part T' of FIG. 13A, according to example embodiments.
Figure 21A:
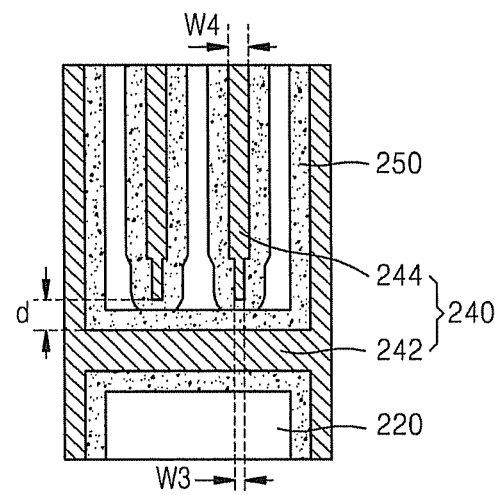
Figure 21B:
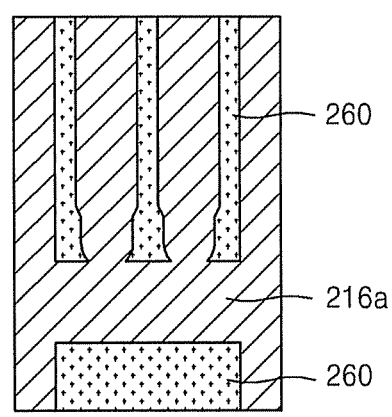

FIGS. 20, 21A, and 21B are views illustrating a part T' of FIG. 13A to illustrate various end parts of dummy lines formed according to a relative position between the crossing sub-patterns 242 and the lines 244. Referring to FIG. 20, the crossing sub-patterns 242 keeps distances d from the lines 244.

If the distance d is smaller than two times the thickness of the spacer material layer 250 when the first mask 230 includes the crossing sub-patterns 24 to cover the whole part of the dummy region 205, ends of the dummy lines 260 may be separated from one another without a bridge.

If the distance d is greater than two times the thickness of the spacer material layer 250a, the bridge 262 may be formed.

Even if a bridge is not formed, shapes of end parts of the lines 244 may be formed so that widths W3 of the end parts of the lines 244 are narrower than widths W4 of another parts of the lines 244, i.e., body parts, thereby forming taps at the end parts of the dummy lines 260. In this case, if the distance d is greater than two times the thickness of the spacer material layer 250a, the bridge 262 (refer to FIG. 19A) is formed. Referring to FIG. 21A, the distance d is smaller than two times the thickness of the spacer material layer 250a (refer to FIG. 14B), the end parts of the dummy lines 260 may be separated from one another without forming a bridge as shown in FIG. 21B. However, since taps having wider widths are formed at the end parts of the dummy lines 260, the dummy lines 260 may be fabricated at a high quality without voids.

Figure 22:
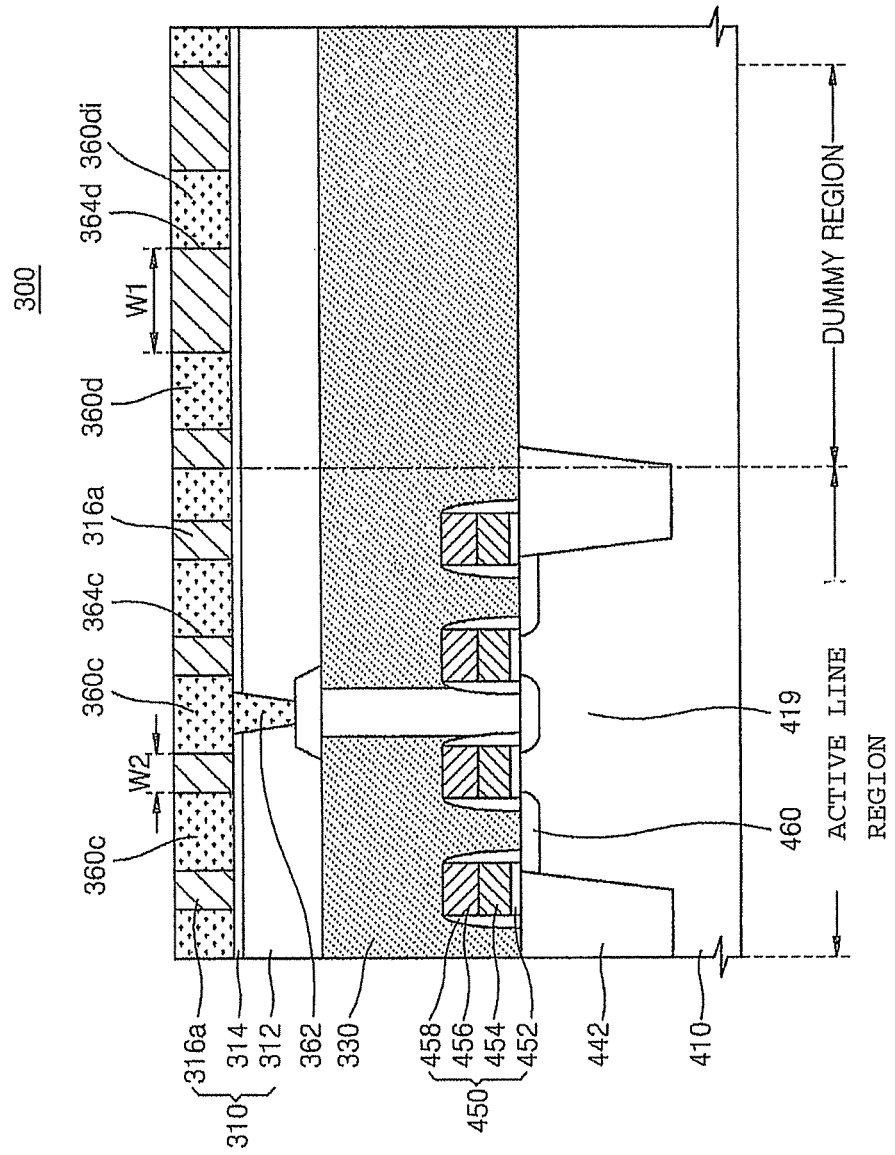
FIG. 22 is a cross-sectional view illustrating a semiconductor device according to example embodiments of inventive concepts.

A semiconductor device 300 according to example embodiments of inventive concepts will now be described with reference to FIG. 22. Referring to FIG. 22, the semiconductor device 300 includes a semiconductor substrate 410 which is divided into an active line region and a dummy region adjacent to the active line region. Cell lines 360c are formed in cell trenches 364c formed in the active line region, and dummy lines 360d are formed in dummy trenches 364d formed in the dummy region. In particular, a width W1 between the dummy lines 360d may be wider than a width W2 between the cell lines 360c.

The dummy lines 360d may be combinations of dummy lines 360di which extend in line shapes in a direction perpendicular to the ground. Widths of the dummy lines 360di may be narrower than distances among the dummy lines 360di. A ratio between the widths of the dummy lines 360di and the distances among the dummy lines 360di may be between about 1:2.5 and about 1:3.

For example, the active line region may include an active region 419 which is defined by an isolation region 442 and in which transistors are formed. The transistors includes gate structures 450 and source/drain regions 460. The gate structures 450 include gate insulating layers 452, gate electrodes 454, capping layers 456, and spacers 458.

The transistors are insulated from one another by a first interlayer insulating layer 330, and a second interlayer insulating layer 310 is further formed on the first interlayer insulating layer 330. The second interlayer insulating layer 310 includes a first insulating layer 312, an etch stop layer 314, and a second insulating layer 316a that are sequentially stacked on the first interlayer insulating layer 330. Also, the cell trenches 364c and the dummy trenches 364d are formed in the second insulating layer 316a, and the cell lines 360c and the dummy lines 360d are respectively formed in the cell trenches 364c and the dummy trenches 364d. The cell lines 360c and/or the dummy lines 360d may be formed of Cu or a Cu alloy.

In particular, contacts 362 and the cell lines 360c, which are electrically connected to the drain regions of the transistors, may be formed in dual damascene structures.

The second interlayer insulating layer 310 may be similar to a second insulating layer as shown in FIGS. 8A, 19A, or FIG. 21B. Widths of ends of the dummy lines 360di, which extend in the dummy region in a direction perpendicular to the ground, may be wider than widths of another parts of the dummy lines 360di, in particular, body parts.

Just as FIGS. 8A and 19A illustrate the ends of at least two or more dummy lines 160 or 260 may be connected to one another, the ends of at least two or more dummy lines 360di may be connected to one another.

Figure 23:
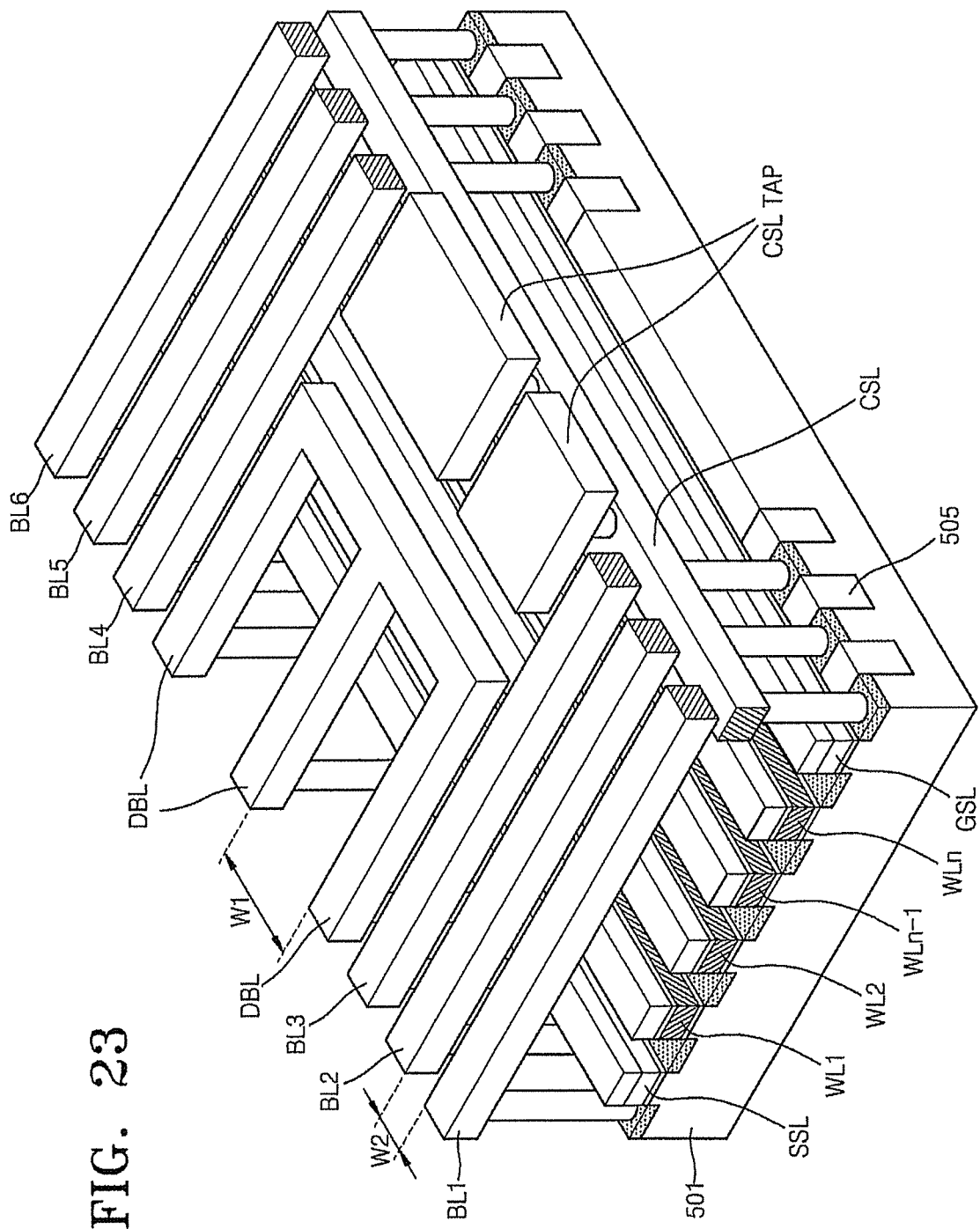
FIG. 23 is a perspective view of a semiconductor memory device according to example embodiments of inventive concepts.

FIG. 23 is a perspective view illustrating a semiconductor memory device according to example embodiments of inventive concepts. FIG. 23 illustrates main parts except for interlayer insulating layers to illustrate relative position relations among elements. However, example embodiments of the inventive concepts are not limited to FIG. 23.

Referring to FIG. 23, a group of wordlines $WL_1$, $WL_2$, ..., $WL_{n-1}$, and $WL_n$ extend in a first direction. The wordlines $WL_1$, $WL_2$, ..., $WL_{n-1}$, and $WL_n$ are formed on a substrate 501 so that gate insulating layers are formed among the wordlines $WL_1$, $WL_2$, ..., $WL_{n-1}$, and $WL_n$. Also, cells may be separated from one another through isolation layers 505 that are repeatedly disposed in the first direction that is a longitudinal direction of the wordlines $WL_1$, $WL_2$, ..., $WL_{n-1}$, and $WL_n$. Each of the wordlines $WL_1$, $WL_2$, ..., $WL_{n-1}$, and $WL_n$ may include a charge trap layer, a dielectric layer, and a control gate.

A string selection line (SSL) is disposed on a side of the wordlines $WL_1$, $WL_2$, ..., $WL_{n-1}$, and $WL_n$, and a ground selection line (GSL) is disposed on an other side of the wordlines $WL_1$, $WL_2$, ..., $WL_{n-1}$, and $WL_n$.

Bitline sets may be disposed above the wordlines $WL_1$, $WL_2$, ..., $WL_{n-1}$, and $WL_n$. The bitline sets may extend in a second direction different from the first direction. In particular, the bitline sets may include first bitline sets $BL_1$, $BL_2$, and $BL_3$ and second bitline sets $BL_4$, $BL_5$, and $BL_6$. Here, each of the bitline sets includes three bitlines but may include a larger number of bitlines. The first bitline sets $BL_1$, $BL_2$, and $BL_3$ and the second bitline sets BL$_4$, BL$_5$, and BL$_6$ may be respectively electrically connected to the SSL.

A plurality of dummy bitlines (DBLs) are disposed between the first bitline sets BL$_1$, BL$_2$, and BL$_3$ and the second bitline sets BL$_4$, BL$_5$, and BL$_6$. The DBLs may have the same level as the first bitline sets BL$_1$, BL$_2$, and BL$_3$ and the second bitline sets BL$_4$, BL$_5$, and BL$_6$. Distances W1 among the DBLs may be wider than distances W2 of bitlines of the first bitline sets BL$_1$, BL$_2$, and BL$_3$.

A common source line (CSL) may be electrically connected to the GSL. A level of the CSL may be higher than levels of the wordlines WL$_1$, WL$_2$, . . . , WL$_{n-1}$, and WL$_n$. Also, the level of the CSL may be lower than levels of the bitline sets. The CSL is electrically connected to CSL taps (CSL TAP) which may have the same levels as the DBLs.

The DBLs may be physically connected to the SSLs and/or the GSLs. Also, as shown in FIG. 23, end parts of the DBLs may be connected to one another.

While some example embodiments of inventive concepts have been particularly shown and described, it will be understood that various changes in form and details may be made therein without departing from the spirit and scope of the following claims.

What is claimed is:

1. A method of forming micropatterns, comprising:
    forming a first mask on a substrate,
        the substrate including a dummy region adjacent to an active line region,
        the first mask covering at least a part of the dummy region and exposing a portion of the substrate;
    forming mold mask patterns on the first mask and the exposed portion of the substrate;
    forming spacers on sidewalls of the mold mask patterns;
    forming second masks by removing a part of the first mask exposed through the mold mask patterns and the spacers;
    removing the mold mask patterns; and
    forming micropatterns by etching the substrate using the spacers and the second masks as etch masks.

2. The method of claim 1, wherein the first mask covers all of the dummy region.

3. The method of claim 1, wherein at least some of the mold mask patterns have line-and-space sub-patterns across the active line region and the dummy region.

4. The method of claim 3, wherein the line-and-space sub-patterns of the at least some of the mold mask patterns include lines at uniform intervals.

5. The method of claim 4, wherein a ratio between a width of the lines of the line-and-space sub-patterns of the at least some of the mold mask patterns and a width of the spaces of the line-and-space sub-patterns of the at least some of the mold mask patterns is between about 1:2.5 and about 1:3.

6. The method of claim 3, wherein at least one of the lines of the at least some of the mold mask patterns of the dummy region extends to at least an end of the first mask.

7. The method of claim 3, wherein the forming the spacers comprises:
    forming a spacer material layer on the substrate, the first mask, and the mold mask patterns; and
    anisotropically etching the spacer material layer, wherein
        an end of at least one of lines of the at least some of the mold mask patterns of the dummy region exists on the first mask, and
        a distance between the end of the line of the at least some of the mold mask patterns and an end of the first mask positioned in a direction in which the line of the at least some of the mold mask patterns extends is greater than a thickness of the spacer material layer.

8. The method of claim 7, wherein
    the forming the micropatterns includes etching the substrate to form at least two first recesses and at least one second recess in the dummy region,
    the two or more first recesses extend in a direction parallel with the line of the at least some of the mold mask patterns,
    the at least one second recess connects the two or more first recesses, and
    the at least one second recess is not parallel with the line of the at least some of the mold mask patterns.

9. The method of claim 7, wherein a distance between the end of the line of the at least some of the mold mask patterns and a most adjacent mold mask patterns except for the line of the at least some of the mold mask patterns is greater than two times the thickness of the spacer material layer.

10. The method of claim 3, wherein the forming the spacers comprises:
    forming a spacer material layer on the substrate, the first mask, and the mold mask patterns; and
    anisotropically etching the spacer material layer, wherein
        two adjacent lines of the lines of the at least some of the mold mask patterns of the dummy region have narrower widths at ends of the two adjacent lines than at other parts of the two adjacent lines,
        a bridge spacer is on sidewalls of the mold mask patterns except for the two adjacent lines, and
        the bridge spacer connects to spacers on the two adjacent lines.

11. The method of claim 10, wherein
    the substrate includes two active line regions that are adjacent to each other,
    the dummy region is between the two active line regions,
    the mold mask patterns include parts that connect the two active line regions,
    and the bridge spacer is on sidewalls of the parts of the mold mask patterns.

12. The method of claim 1, wherein the forming the spacers and the forming the second masks include an etching process.

13. The method of claim 1, wherein the removing the mold mask patterns occurs after the forming second masks.

14. The method of claim 13, wherein the second masks are not removed when the mold mask patterns are removed.

15. The method of claim 1, wherein
    the forming the micropatterns includes forming micropatterns in the dummy region and forming micropatterns in the active line region, and
    a width of the micropatterns in the dummy region is wider than a width of the micropatterns in the active region.

16. The method of claim 1, wherein:
    the substrate includes two active line regions that are adjacent to each other,
    the dummy region is between the two active line regions; and
    the mold mask patterns include crossing sub-patterns that connect the two active line regions.

17. A method of forming micropatterns, comprising:
    forming mold mask patterns on a substrate,
        the mold mask patterns including at least two first mold structures on an active line region of the substrate and at least two second mold structures on a dummy region of the substrate,
        the at least two first and second mold structures each having sidewalls;
    forming a spacer pattern including, first spacers on the sidewalls of the at least two first mold structures, and
second spacers on the sidewalls of the at least two second mold structures, forming micropatterns by,
removing the at least two first mold structures;
removing a portion of the active line region of the substrate not covered by the first spacers after the removing the at least two first mold structures, and
removing a portion of the dummy region of the substrate not covered by the at least two second mold structures and the second spacers.

18. The method of claim 17, further comprising:
forming a first mask that covers all of the dummy region of the substrate, wherein
the forming mold mask patterns on the substrate includes forming the at least two second mold structures on the first mask,
the forming a spacer pattern includes forming the second spacers on the first mask,
the forming the micropatterns includes,
forming a second mask by etching a part of the first mask exposed between the second spacers,
removing the at least two second mold structures, and
etching the substrate using the first and second spacers and the second mask as an etch mask.

19. The method of claim 17, further comprising:
forming a first mask that covers all of the dummy region of the substrate, the at least two second mold structures, and the second spacers; and
removing the first mask after removing the at least two first mold structures;
wherein removing the at least two first mold structures is performed after forming the first mask, and
wherein the forming the micropatterns includes etching the substrate using the first spacers, the at least two second mold structures, and the second spacers as an etch mask.

20. A method of forming damascene metallization, comprising:
the method of claim 17, wherein
the substrate further includes,
a first insulating layer,
an etch stop layer on the first insulating layer,
a second insulating layer on the etch stop layer, and
a sacrificial layer on the second insulating layer,
the forming the micropatterns includes,
forming first recesses by removing a portion of the sacrificial layer and the second insulating layer in the active line region of the substrate that is not covered by the first spacers, and
forming second recesses by removing a portion of the sacrificial layer and the second insulating layer in the dummy region of the substrate that is not covered by the at least two second mold structures and the second spacers; and
the method further includes forming a conductive material in the first and second recesses.

21. The method of claim 17, further comprising:
forming a first mask pattern on the dummy region of the substrate but not the active line region of the substrate, the first mask pattern being one of,
between the substrate and the at least two second mold structures and the second spacers, and
on the at least two second mold structures and the second spacers;
removing one of the first mask pattern and the at least two second mold structures, wherein
the removing the portion of the active line region includes etching the portion of the active line region using the first spacers as an etch mask, and
the removing the portion of the dummy region including etching the portion of the dummy region using the second spacers and a remaining one of the first mask pattern and the at least two second mold structures as a different etch mask.

22. The method of claim 17, wherein
the removing the portion of the active line region defines recesses in the active line region that are spaced apart by a first width,
the removing the portion of the dummy line region defines recesses in the dummy line region that are spaced apart by a second width, and
the second width is greater than the first width.

* * * * *